US006721083B2

(12) United States Patent
Jacobson et al.

(10) Patent No.: US 6,721,083 B2
(45) Date of Patent: Apr. 13, 2004

(54) ELECTROPHORETIC DISPLAYS USING NANOPARTICLES

(75) Inventors: Joseph M. Jacobson, Newton Centre, MA (US); Anthony E. Pullen, Belmont, MA (US); Thomas H. Whitesides, Cambridge, MA (US); Paul S. Drzaic, Morgan Hill, CA (US); Ian D. Morrison, Acton, MA (US); Jianna Wang, Waltham, MA (US); Caprice L. Gray, Somerville, MA (US)

(73) Assignee: E Ink Corporation, Cambridge, MA (US)

( * ) Notice: Subject to any disclaimer, the term of this patent is extended or adjusted under 35 U.S.C. 154(b) by 0 days.

(21) Appl. No.: 10/065,617

(22) Filed: Nov. 4, 2002

(65) Prior Publication Data

US 2003/0096113 A1 May 22, 2003

Related U.S. Application Data

(63) Continuation-in-part of application No. 10/054,721, filed on Nov. 12, 2001, now Pat. No. 6,538,801, which is a continuation-in-part of application No. 09/565,417, filed on May 5, 2000, now Pat. No. 6,323,989, which is a continuation-in-part of application No. 09/471,604, filed on Dec. 23, 1999, which is a division of application No. 08/935,800, filed on Sep. 23, 1997, now Pat. No. 6,120,588, and a continuation-in-part of application No. PCT/US96/13469, filed on Aug. 20, 1996.

(60) Provisional application No. 60/350,735, filed on Nov. 12, 2001, provisional application No. 60/254,342, filed on Dec. 8, 2000, provisional application No. 60/134,245, filed on May 13, 1999, provisional application No. 60/132,643, filed on May 5, 1999, provisional application No. 60/132,644, filed on May 5, 1999, provisional application No. 60/035, 622, filed on Sep. 24, 1996, and provisional application No. 60/022,222, filed on Jul. 19, 1996.

(51) Int. Cl.[7] .......................... G02B 26/00; G09G 3/34; B01J 13/02
(52) U.S. Cl. ........................ 359/296; 345/107; 264/4.1; 264/4.3; 106/31.16
(58) Field of Search .......................... 359/296; 345/108, 345/107, 85, 86; 264/4, 4.1, 4.3; 106/31.16, 31.32, 31.64

(56) References Cited

U.S. PATENT DOCUMENTS 5,801,033 A * 9/1998 Hubbell et al. .............. 264/4.1

* cited by examiner

*Primary Examiner*—Loha Ben
(74) *Attorney, Agent, or Firm*—David J. Cole

(57) ABSTRACT

An electrophoretic display comprises a fluid and a plurality of nanoparticles having diameters substantially less the wavelengths of visible light such that, when the nanoparticles are in a dispersed state and uniformly dispersed throughout the fluid, the fluid presents a first optical characteristic, but when the nanoparticles are in an aggregated state in which they are gathered into aggregates substantially larger than the individual nanoparticles, the fluid presents a second optical characteristic different from the first optical characteristic. The electrophoretic display further comprises at least one electrode arranged to apply an electric field to the nanoparticle-containing fluid and thereby move the nanoparticles between their dispersed and aggregated states. Various compound particles comprising multiple nanoparticles, alone or in combination with larger objects, and processes for the preparation of such compound particles, are also described.

26 Claims, 19 Drawing Sheets

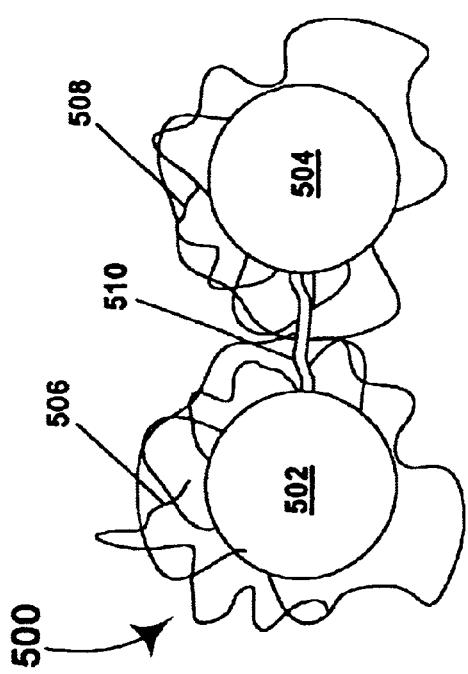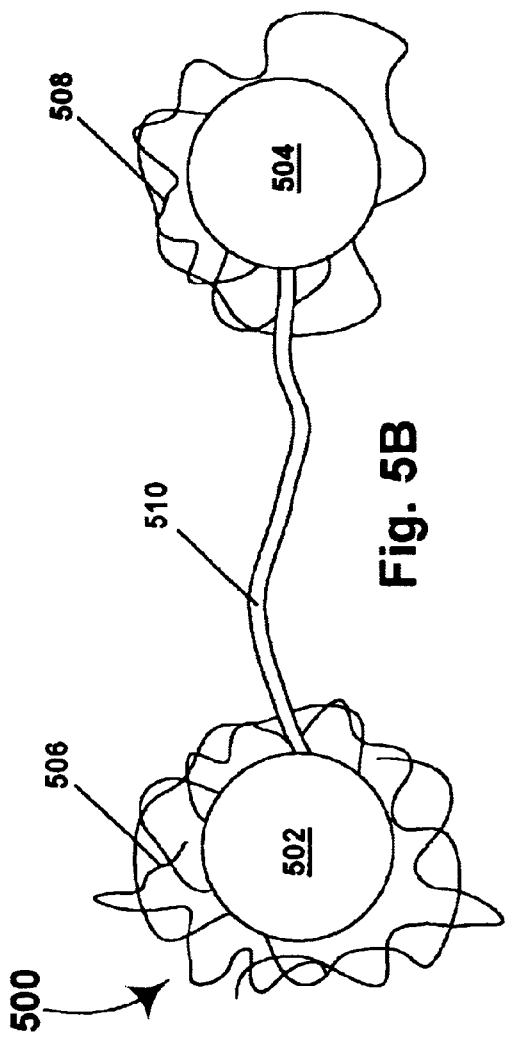

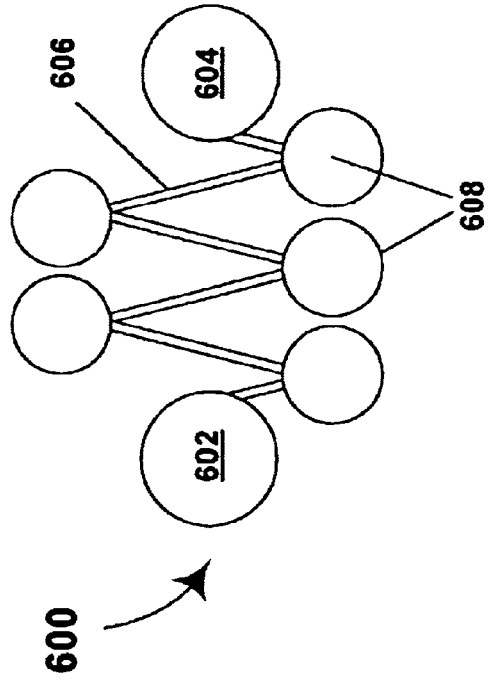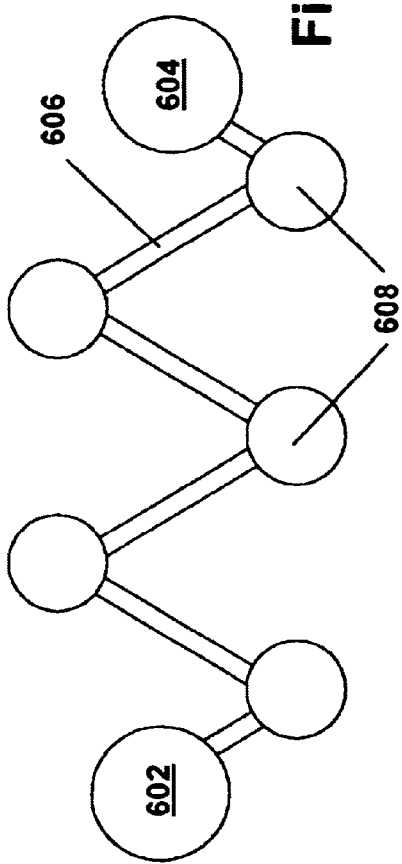

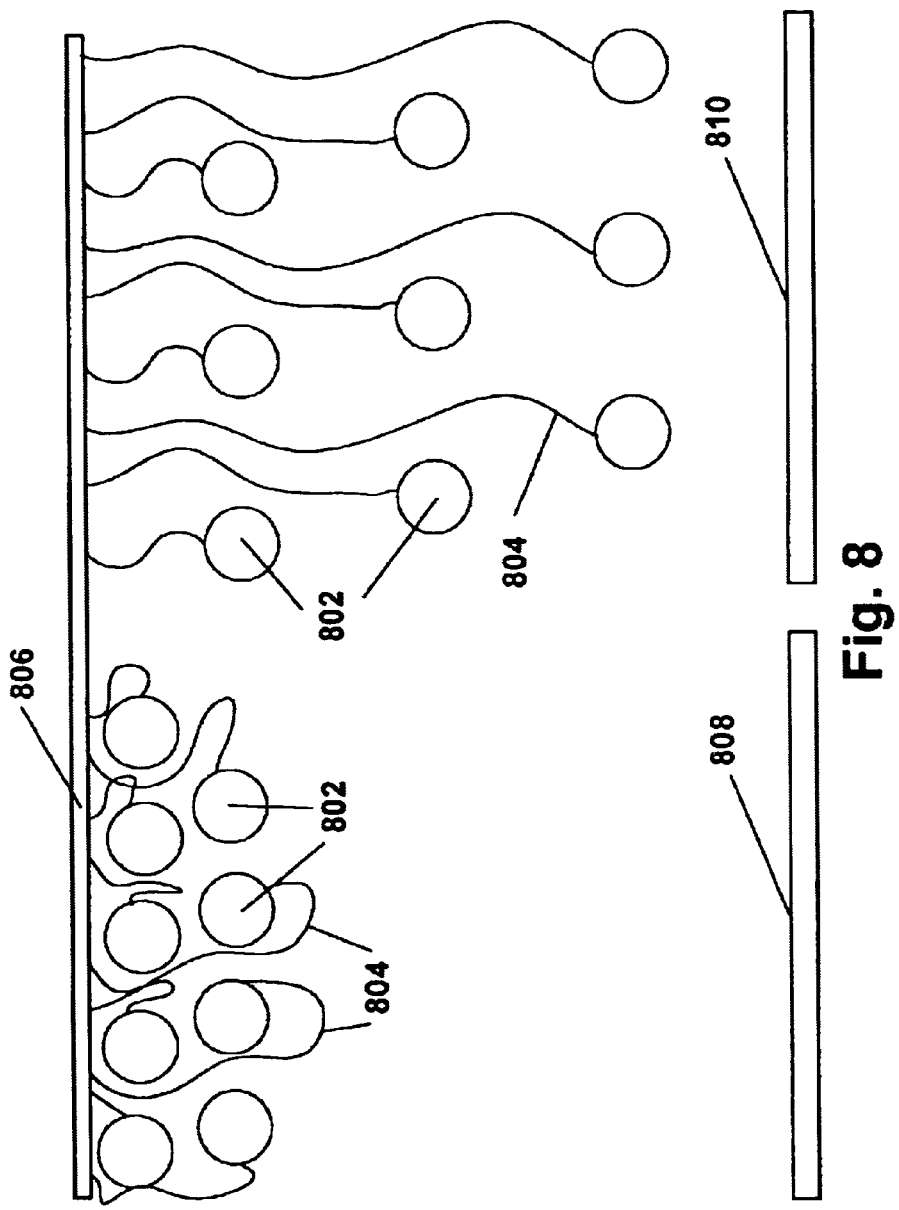

ELECTROPHORETIC DISPLAYS USING NANOPARTICLES

CROSS REFERENCE TO RELATED APPLICATIONS

This application is a continuation-in-part of application Ser. No. 10/054,721, filed Nov. 12, 2001 (published under No. 2002/0145792, now U.S. Pat. No. 6,538,801), which itself is a continuation-in-part of application Ser. No. 09/565,417, filed May 5, 2000 (now U.S. Pat. No. 6,323, 989), which itself is a continuation-in-part of application Ser. No. 09/471,604, filed Dec. 23, 1999 (now U.S. Pat. No. 6,422,687), which is a divisional of application Ser. No. 08/935,800 filed Sep. 23, 1997 (now U.S. Pat. No. 6,120, 588). Application Ser. No. 08/935,800 claims priority from Provisional Application Ser. No. 60/035,622, filed Sep. 24, 1996, and is also a continuation-in-part of International Application No. PCT/US96/13469, filed Aug. 20, 1996, which itself claims priority from Provisional Application Ser. No. 60/022,222, filed Jul. 19, 1996. Application Ser. No. 09/565,417 also claims priority from Provisional Applications Ser. Nos. 60/132,644 and 60/132,643, both filed May 5, 1999, and Provisional Application Ser. No. 60/134,245, filed May 12, 1999. Application Ser. No. 10/054,721 also claims priority from Application Ser. No. 60/254,342, filed Dec. 8, 2000. Finally, this application claims priority from Application Ser. No. 60/350,735, filed Nov. 12, 2001.

This application is also related to application Ser. No. 09/683,035, filed Nov. 12, 2001 (now U.S. Pat. No. 6,580, 545). The entire disclosures of all the aforementioned related applications are herein incorporated by reference.

BACKGROUND OF INVENTION

The present invention relates to electrophoretic displays using nanoparticles, that is particles having diameters substantially less than the wavelengths of visible light. The present invention also relates to nanoparticle assemblies and to displays incorporating such assemblies. In one aspect this invention relates to nanoparticle assemblies and to displays in which one nanoparticle is linked to a second nanoparticle or other object by means of a linking moiety, the electrical conductivity of which can be varied.

Electrophoretic displays have been the subject of intense research and development for a number of years. Such displays use a display medium comprising a plurality of electrically charged particles suspended in a fluid. Electrodes are provided adjacent the display medium so that the charged particles can be moved through the fluid by applying an electric field to the medium. In one type of such electrophoretic display, the medium comprises a single type of particle having one optical characteristic in a fluid which has a different optical characteristic. In a second type of such electrophoretic display, the medium contains two different types of particles differing in at least one optical characteristic and in electrophoretic mobility; the particles may or may not bear charges of opposite polarity. The optical characteristic which is varied is typically color visible to the human eye, but may, alternatively or in addition, be any one of more of reflectivity, retroreflectivity, luminescence, fluorescence, phosphorescence, or (in the case of displays intended for machine reading) color in the broader sense of meaning a difference in absorption or reflectance at non-visible wavelengths.

Electrophoretic displays can be divided into two main types, namely unencapsulated and encapsulated displays. In an unencapsulated electrophoretic display, the electrophoretic medium is present as a bulk liquid, typically in the form of a flat film of the liquid present between two parallel, spaced electrodes. Such unencapsulated displays typically have problems with their long-term image quality which have prevented their widespread usage. For example, particles that make up such electrophoretic displays tend to cluster and settle, resulting in inadequate service-life for these displays.

An encapsulated, electrophoretic display differs from an unencapsulated display in that the particle-containing fluid is not present as a bulk liquid but instead is confined within the walls of a large number of small capsules. Encapsulated displays typically do not suffer from the clustering and settling failure mode of traditional electrophoretic devices and provides further advantages, such as the ability to print or coat the display on a wide variety of flexible and rigid substrates.

For further details regarding encapsulated electrophoretic displays, the reader is referred to U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,721; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; and 6,459,418; and U.S. Patent Applications Publication Nos. 2001/0045934; 2002/0019081; 2002/0021270; 2002/0053900; 2002/0060321; 2002/0063661; 2002/0063677; 2002/0090980; 2002/106847; 2002/0113770; 2002/0130832; and 2002/0131147, and International Applications Publication Nos. WO 99/53373; WO 99/59101; WO 99/67678; WO 00/05704; WO 00/20922; WO 00/38000; WO 00/38001; WO 00/36560; WO 00/20922; WO 00/36666; WO 00/67110; WO 00/67327; WO 01/07961; WO 01/08241; WO 01/17029; and WO 01/17041. The entire disclosures of all these patents and published applications, all of which are in the name of, or assigned to, the Massachusetts Institute of Technology (MIT) or E Ink Corporation, are herein incorporated by reference.

Prior art electrophoretic displays use particles, which, while small (typically about 0.25 to 2 $\mu$m), are sufficiently large that they have essentially the bulk properties of the material from which they are formed. The particles keep the same optical properties during the time they are present in the electrophoretic display; the appearance of the display is changed by moving the particles within the suspending fluid using an appropriate electrical field. For example, consider the prior art electrophoretic display represented in a schematic manner in FIG. 1 of the accompanying drawings. This display is provided on its front viewing surface (the top surface as illustrated in FIG. 1) with a common, transparent front electrode 100, and on its rear surface with an opaque substrate 102 carrying a matrix of discrete electrodes; only two of these electrodes, designated 104 and 106 respectively, are shown in FIG. 1. Each of the discrete electrodes 104 and 106 defines a pixel of the display. An encapsulated electrophoretic medium (generally designated 108) is disposed between the common electrode 100 and the discrete electrodes 104 and 106; for ease of illustration, FIG. 1 shows only a single capsule 110 of the medium 108 associated with each discrete electrode 104 and 106, although in practice a plurality of capsules (typically at least 20) would be associated with each discrete electrode. Also for ease of illustration, the capsules are shown in FIG. 1 as of circular cross-section, although in practice it is preferred that they have a flattened form.

Each of the capsules 110 comprises a capsule wall 112, a dark colored fluid 114 (assumed for present purposes to be blue) contained within this capsule wall 112 and a plurality of light colored charged particles 116 (assumed for present purposes to be titania particles 250–500 nm in diameter) suspended in the fluid 114. For purposes of illustration, it is assumed that the titania particles 116 are negatively charged so that they will be drawn to whichever of their associated discrete electrode and the common electrode is at the higher potential. However, the particles 116 could alternatively be positively charged. Also, the particles could be dark in color and the fluid 114 light in color so long as sufficient color contrast occurs as the particles move between the front and rear surfaces of the display medium, as shown in FIG. 1.

In the display shown in FIG. 1, each of the discrete electrodes is held at either 0 or +V (where V is a drive voltage) while the common front electrode 100 is held at an intermediate voltage +V/2. Since the titania particles 116 are negatively charged, they will be attracted to whichever of the two adjacent electrodes is at the higher potential. Thus, in FIG. 1, discrete electrode 104 is shown as being held at 0, so that the particles 116 within the adjacent capsule move adjacent the common electrode 100, and thus adjacent the top, viewing surface of the display. Accordingly, the pixel associated with discrete electrode 104 appears white, since light entering the viewing surface is strongly reflected from the titania particles adjacent this surface. On the other hand, discrete electrode 106 in FIG. 1 is shown as being held at +V, so that the particles 116 within the adjacent capsule move adjacent the electrode 106, and the color of the pixel associated with electrode 106 is that exhibited by light entering the viewing surface of the display, passing through the colored fluid 114, being reflected from the titania particles adjacent electrode 116, passing back through the colored fluid 114, and finally re-emerging from the viewing surface of the display, i.e., the associated pixel appears blue.

It should be noted that the change in the appearance of a pixel of this electrophoretic display as the voltage on the associated discrete electrode changes is solely due to the change of the position of the titania particles within the fluid; the color and other optical characteristics of the titania particles themselves do not change during operation of the electrophoretic display. In both the pixels shown in FIG. 1, the function of the titania particles is to scatter light strongly.

Obviously, the type of display shown in FIG. 1 can use particles of pigments other than titania, for example magenta pigments such as Hostaperm Pink E (Hoechst Celanese Corporation) and Lithol Scarlet (BASF), yellow pigments such as Diarylide Yellow (Dominion Color Company), cyan pigments such as Sudan Blue OS (BASF), and the like (see U.S. Pat. No. 5,364,726). However, in all cases the contribution of the pigment to the color of the display depends on the position of the pigment with respect to the viewer. When the pigment particles are adjacent the viewing surface of the display, the light scattered by the pigment is the color viewed. When the pigment is adjacent the rear surface of the display, the color is the color obtained when light passes through the fluid, is scattered from the pigment adjacent the rear surface, and then passes through the fluid again.

The single particle/color fluid type of electrophoretic display shown in FIG. 1 has two disadvantages. Firstly, the display can only produce two colors, in the manner already described, and is not capable of producing a wide range of colors. Secondly, to effect a change between the two color states, it is necessary for the titania particles to move under the electric field essentially the full distance between the two electrodes, and in practice this typically leads to a transition time between the two states of a few hundred milliseconds, and a frame rate of the order of 1 Hz or less, which is too slow for video applications.

Combinations of different colored pigments can be used in electrophoretic displays to form different colored images. If the different colored pigments are contained in the same volume of liquid, different colors are possible provided that the motion of each color of pigment under the influence of an electric field is different. For example, a mixture of white pigment particles positively charged and black pigment particles negatively charged could be used to make black on white or white on black images by application of X appropriates electric fields.

An electrophoretic display containing only two differently colored pigments is only capable of producing a few different colors: two when either color pigment is on the viewing side of the display, one when both pigments are on the viewing side of the display, and one when both pigments are on the back of the display. Such displays are not capable of producing a wide range of colors.

When the electrophoretic display contains just two colored pigments then the position of the colored pigments can be controlled if the colored pigments have electric charges of opposite polarity. With the electric field on with one polarity, the pigment of one color will migrate to the front of the display and the pigment of the other color will migrate to the back of the display. When the electric field is reversed, the pigments will exchange places, changing the color visible to the viewer. The time necessary to switch the color of the display is the time necessary for the pigment particles to diffuse under an applied electric field from one side of the display to the other, and is thus similar in magnitude to that of the electrophoretic display discussed above with reference to FIG. 1.

It is possible to construct an electrophoretic display composed of two different color pigments with the same polarity of charge but substantially different electrophoretic mobilities, if the electrophoretic mobility of one pigment is substantially different from that of the other. One appropriate addressing scheme is to pull all the particles to the rear of the display with the appropriate electric field. The reverse electric field is then applied only as long as it takes the more mobile of the two types of particles to reach the front viewing surface. This produces the color of the higher mobility particles. To produce the color of the lower mobility particles, all of the particles are pulled to the front of the display. Then, the field is reversed long enough that the more mobile particles are pulled away from the front electrode, leaving the lower mobility particles adjacent the front electrode. This produces the color of the lower mobility particles. The average time necessary to switch the color of the display is still at least the time necessary for the pigment particles to diffuse under an applied electric field from one side of the display to the other.

In theory, it would be possible to produce electrophoretic displays with a X multitude of different colored pigments dispersed in a fluid. If each colored pigment had its own distinct electrophoretic mobility, then a range of colors could be produced in a manner similar to that just described for an electrophoretic display composed of two colored pigments with the same sign, but different magnitudes of electrophoretic mobilities. However, two obvious problems are likely to render such media containing more than three or four colors extremely difficult to produce in-practice. All pigment dispersions, even of the same chemistry, have distributions of electrophoretic mobilities arising from a distribution of particle sizes, a distribution of particle charges, and a distribution of particle shapes. In order to control the image color with a multitude of different colored pigments, the distributions of electrophoretic mobilities for each color pigment would have to be substantially separated. This is a difficult challenge. Not only would the distributions of electrophoretic mobilities have to be substantially non-overlapping when the display was manufactured, they would have to remain substantially non-overlapping for the useful life of the display. Furthermore, the switching time necessary to switch the color of the display would still be at least as great as in the electrophoretic displays discussed above.

One approach to expanding the limited range of colors available from conventional electrophoretic displays is to place an array of colored filters over the pixels of the display. For example, the display shown in FIG. 1 could be modified by changing the color of the fluid 114 to black or gray instead of blue and then placing an array of color filters (say red, green and blue) over the individual pixels of the display. Moving the titania particles adjacent the viewing surface of a pixel covered with a red filter would color that pixel red, whereas moving the titania particles of the same pixel adjacent the rear surface of the display would render the pixel dark or black. The main problem with this approach to generating color is that the brightness of the display is limited by the pixelation of the color filter. For example, if a red color is desired, the pixels covered by red filters are set to appear red. whereas the pixels covered by green and blue filters are set to appear dark, so that only a fraction of the display surface has the desired color while the remaining portion is dark, thus limiting the brightness of any color obtained.

In encapsulated electrophoretic displays another method can be used to create different colored images, namely the different colored particles can be encapsulated in different microcapsules. Microcapsules containing each of the colors can be coated on top of the appropriate addressing electrodes so that the color of choice can be displayed by moving the pigment of that color in its capsule from the back of the display to the front while all the other color pigments in their own capsules are kept at the back of the display. This design suffers from one of the same limitations as the display using color filters. When a particular color pigment is moved to the viewing surface of the display and all the other colors are moved to the back of the display, then the display surface only shows the desired color over a fraction of its surface with all the other surface showing the background color. This limits the optical performance obtainable.

Thus, a common feature of all these prior art methods to create color in electrophoretic displays is that the different colors are created primarily by controlling the position of the particles in the display, that is the color is determined by whether any particular colored pigment particles are near the viewing surface of the display or near the back of the display. Also, the time necessary to change colors is the time necessary for particles to move under the influence of an applied electric field from one side of the display to the other, and this time is typically of the order of hundreds of milliseconds.

The present invention seeks to provide electrophoretic displays which can achieve a greater variety of colors than are possible in prior art displays. The present invention also seeks to provide electrophoretic displays with reduced switching times.

SUMMARY OF INVENTION

Accordingly, the present invention provides an electrophoretic display comprising a fluid and a plurality of nanoparticles having diameters substantially less the wavelengths of visible light such that, when the nanoparticles are in a dispersed state and uniformly dispersed throughout the fluid, the fluid presents a first optical characteristic, but when the nanoparticles are in an aggregated state in which they are gathered into aggregates substantially larger than the individual nanoparticles, the fluid presents a second optical characteristic different from the first optical characteristic, the electrophoretic display further comprising at least one electrode arranged to apply an electric field to the nanoparticle-containing fluid and thereby move the nanoparticles between their dispersed and aggregated states.

The present invention also provides a process for forming a nanoparticle assembly comprising a nanoparticle secured to an object via a linking group. This process comprises treating a nanoparticle with a linking reagent comprising the linking group and a first functional group capable of reacting with the nanoparticle under the conditions of the treatment, thereby causing the first functional group to react with the nanoparticle and secure the linking group to the nanoparticle. Thereafter the nanoparticle carrying the linking group is treated with a modifying reagent effective to generate a second functional group on the linking group, this second functional group being capable of reacting with the object. Finally, the nanoparticle carrying the linking group and the second functional group is contacted with the object under conditions effective to cause the second functional group to react with the object and thereby form the nanoparticle assembly.

The present invention also provides an electrophoretic display comprising a fluid, a plurality of a first species of nanoparticles in the fluid and a plurality of a second species of nanoparticles in the fluid, the first and second species of nanoparticles differing in electrophoretic mobility. The display has a viewing surface through which the nanoparticle-containing fluid can be viewed, and also has:

(a) a first display state in which the first and second species of nanoparticles are dispersed through the fluid;

(b) a second display state in which the first species of nanoparticles are aggregated and visible through the viewing surface; and (c) a third display state in which the second species of nanoparticles are aggregated and visible through the viewing surface, the first, second and third display states differing in at least one optical characteristic.

This type of display may hereinafter for convenience be called a "single layer display" of the invention.

The present invention also provides an electronic display comprising, in order, a light-transmissive first electrode forming a viewing surface; an electrophoretic medium comprising a plurality of nanoparticles in a light-transmissive fluid; a light transmissive second electrode; an electro-optic medium; and a third electrode. In this display, the electro-optic medium is capable of being switched between a first optical state and a second optical state by application of an electric field between the second and third electrodes. Thus, the electronic display has:

(a) a first display state in which the plurality of nanoparticles are dispersed through the fluid and the electro-optic medium is in its first optical state and visible through the viewing surface;

(b) a second display state in which the plurality of nanoparticles are dispersed through the fluid and the electro-optic medium is in its second optical state and visible through the viewing surface; and (c) a third, display state in which the plurality of nanoparticles are aggregated and visible through the viewing surface, the first, second and third display states differing in at least one optical characteristic.

This type of display may hereinafter for convenience be called a "double layer display" of the invention.

This invention also provides a nanoparticle assembly comprising a nanoparticle having a diameter substantially less than the wavelengths of visible light, an object separate from the nanoparticle, and a flexible filament (or "tether") connecting the nanoparticle and the object, such that at least one optical characteristic of the nanoparticle varies with the spacing between the nanoparticle and the object.

Such nanoparticle/tether assemblies can be of several different types, including:

(a) a dual nanoparticle assembly, as shown in FIGS. 5A and 5B below, in which two nanoparticles are attached to opposed ends of a tether, which is typically a polymeric filament;

(b) a multiple nanoparticle assembly, in which a plurality of nanoparticles are attached via tethers to a central particle;

(c) nanoparticle/macroparticle assemblies, such as that shown in FIG. 8 below, in which a plurality of nanoparticles are attached via tethers to a macroscopic particle, which is typically an electrode; and (d) a "polymer-dispersed" nanoparticle assembly in which a plurality of nanoparticles and dispersed within (and optionally bonded to) a polymeric matrix or gel.

In one form of such nanoparticle assemblies, the optical characteristics of the assemblies are varied by changing the distances between nanoparticles; thus, in the nanoparticles assemblies of the aforementioned types, the tethers may function solely as mechanical devices to limit the movement of nanoparticles relative to each other, or to any macroparticle to which they are tethered. However, it has also been discovered that the optical characteristics of nanoparticle assemblies can be varied not only by changing the distance between the nanoparticles within the assembly, but also by changing the electrical conductivity of one or more tethers, and this invention extends to such "variable conductivity" nanoparticle assemblies and to displays incorporating such assemblies.

Thus, this invention also provides a nanoparticle assembly comprising a nanoparticle, a second particle and a tether connecting the nanoparticle to the second particle, the tether having first and second states differing in electrical conductivity such that at least one optical characteristic of the nanoparticle assembly changes when the tether is varied from its first state to its second state.

This invention also provides an electro-optic medium comprising a plurality of such nanoparticle assemblies and means for varying the electrical conductivity of the tethers of the nanoparticle assemblies. In one form of such electro-optic medium, the nanoparticle assemblies are of the type having two nanoparticles joined by a tether, these nanoparticle assemblies being dispersed in a solvent or gel containing an electrolyte. A display of the present invention may be formed by providing such an electro-optic medium with a pair of electrodes on opposed sides of the medium, at least one of these electrodes being substantially transparent.

This invention also relates to a modification of the nanoparticle assemblies of type (b) discussed above, in which a plurality of nanoparticles are attached via tethers to a central particle. It has now been realized that if the central particle and the nanoparticles are given charges of opposite polarity, the tethers can be eliminated.

Thus, the present invention also provides an electro-optic medium comprising:

a suspending fluid;

a plurality of a first type of particle suspended in the suspending fluid, the first type of particle being light transmissive and bearing an electric charge; and a plurality of a second type of particle suspended in the suspending fluid, the second type of particle being smaller than the first type of particle and bearing an electric charge of opposite polarity, the particles being such that when no electric field is applied to the medium and the second type of particles lie on the surfaces of the first type of particles, the medium present a first optical characteristic, but when an electric field is applied to the medium and the second type of particles are removed from the surfaces of the first type of particles and dispersed through the suspending fluid, the medium present a second optical characteristic different from the first optical characteristic.

This type of medium may hereinafter for convenience be called a "tether-less two particle medium".

This invention also provides a nanoparticle assembly comprising a plurality of nanoparticles dispersed in a polymeric medium or gel, the medium or gel having first and second states differing in electrical conductivity such that at least one optical characteristic of the nanoparticle assembly changes when the medium or gel is varied from its first to its second state. In such a nanoparticle assembly, the nanoparticles may or may not be chemically bonded to the polymeric medium or gel.

This invention also provides a nanoparticle assembly comprising a plurality of nanoparticles and a polymer chain, the nanoparticles being spaced from one another along the polymer chain, the polymer having first and second conformations such that the distances between adjacent nanoparticles along the chain differ in the first and second conformations and at least one optical characteristic of the nanoparticle assembly differs between the first and second conformations.

Finally, this invention provides an improvement in a process in which a metal-containing ionic species is transferred from a aqueous phase to an organic phase using a phase transfer reagent, the ionic species subsequently being reduced to produce metal nanoparticles in the organic phase. The improvement comprises using a tetrabutylammonium halide, preferably the bromide, as the charge transfer reagent.

BRIEF DESCRIPTION OF DRAWINGS

Preferred embodiments of the invention, will now be described in more detail, though by way of illustration only, with reference to the accompanying drawings, in which:

FIGS. 5A and 5B are schematic views, similar to that of FIG. 4, showing different states of a single nanoparticle unit of a fourth electrophoretic display of the invention, this unit being generally similar to that shown in FIG. 4 except that the two nanoparticles forming the unit are tethered to each other;

FIGS. 6A and 6B are schematic side elevations, similar to those of FIGS. 5A and 5B respectively, showing different states of a single unit of a fifth electrophoretic display of the invention, thus unit comprising two particles of opposing polarity and a plurality of color-forming nanoparticles all connected to a common filament;

FIG. 8 is a schematic side elevation showing two different states of a seventh electrophoretic display of the invention is which a plurality of nanoparticles are individually tethered to a fixed body;

FIGS. 6A and 16B are schematic views of a tether-less two particle medium of the invention without and with respectively the presence of an electric field.

DETAILED DESCRIPTION

Figure 1:
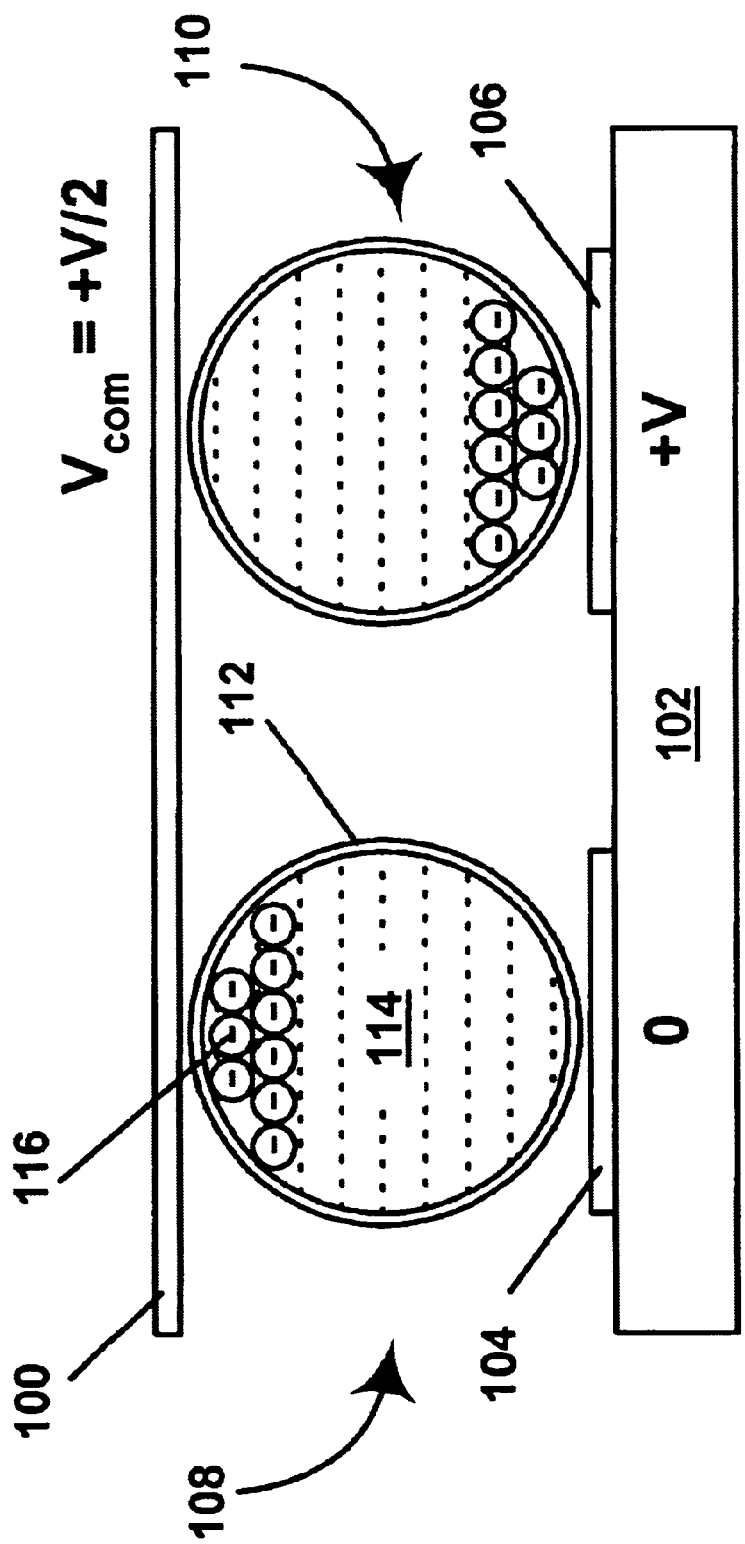
FIG. 1 is a schematic side elevation of a prior art electrophoretic display.

As already mentioned, the electrophoretic display of the present invention uses nanoparticles having diameters substantially less than the wavelengths of visible light. The term "diameter" is-used herein to include what is usually known as the "equivalent diameter" of a non-spherical particle. In contrast to a conventional electrophoretic display, in which the change in the appearance of the display results from movement of the particles within the fluid, in the display of the present invention color change is brought about by changes in the state of aggregation of the nanoparticles.

Nanoparticles are distinguished from the pigment particles used in prior art electrophoretic displays by their size. Pigment particles are typically of the order of several hundred nanometers in diameter, or larger. Thus, the diameters of even the smaller pigment particles are of the same order as the wavelengths of visible light, which vary from about 400 nm for blue light to about 700 nm for red light. It is well known to those skilled in optics that the light scattering power of particles is approximately proportional to the sixth power of the particle diameter for particles having diameters less than the wavelength of the relevant light. Thus, isolated nanoparticles much smaller than the wavelength of light do not appreciably scatter the light and, as such, are effectively transparent. However, the same nanoparticles, when brought into proximity with one another and thus aggregated into larger clusters having diameters comparable to the wavelength of light, scatter light strongly. Thus, by controlling whether the nanoparticles are dispersed or aggregated (into larger isolated particles or into a layer), one can determine whether the nanoparticles appear transparent or turbid, and thus the color of an electrophoretic display can be changed by controlling the degree of aggregation of the nanoparticles.

The upper limit on the size of the nanoparticles which are useful in the present invention will vary somewhat depending upon the nature of the material forming the nanoparticles and the fluid in which they are dispersed; in particular, the light scattering by dispersed nanoparticles depends upon both the size of the nanoparticles themselves and the ratio of the refractive index of the nanoparticles to that of the suspending fluid. Titania has a high refractive index, so that when titania is used as a nanoparticle in a fluid, such as a hydrocarbon fluid, of relatively low refractive index, the titania particles should not exceed about 100 nm in diameter, and preferably do not exceed about 50 nm. Other nanoparticles formed from materials of lower refractive index, for example zinc oxide (refractive index about 2.0), clays and magnesium silicate (both about 1.6) can be larger (up to about 200 nm) and still not scatter light to any substantial extent. Thus, in summary, while in some cases nanoparticles up to about 200 nm may be used, it is generally preferred that the nanoparticles not exceed about 100 nm in diameter and preferably not exceed about 50 nm. Many embodiments of the inventions described herein may make use of nanoparticles having diameters below 20 or even 10 nm.

The material used to form the nanoparticles can be an insulator, a conductor or a semiconductor. Examples of suitable insulators include the titania, zinc oxide, clays; and magnesium silicate already mentioned. Organic insulators could also be used, although such organic materials will typically require thicker layers to achieve good light scattering than do the inorganic insulators already mentioned. Examples of suitable conductors include most metals, especially silver, gold, platinum, palladium and alloys of these metals. Ruthenium, rhodium, osmium and iridium may also be useful. An example of a suitable semiconductor is cadmium selenide.

Although nanoparticles formed from insulators, conductors and semiconductors can all be used in the electrophoretic display of the present invention, the changes in optical characteristics of the electrophoretic medium as the particles move between their dispersed and aggregated states do differ in the three cases. In the case of nanoparticles formed from insulators, as already indicated aggregation of the particles causes a change in efficiency of light scattering in accordance with the predictions of Rayleigh's theory of light scattering. Thus, in this case the first optical characteristic (when the nanoparticles are in their dispersed state) is a low level of light scattering, and the second optical characteristic (when the nanoparticles are in their aggregated state) is a substantially increased level of light scattering.

Conducting nanoparticles, such as silver or gold nanoparticles, also change color with aggregation. This color change is due to the change in the average refractive index as the aggregates form. In contrast to the case of nanoparticles formed from insulators (where aggregation increases the intensity of light scattering but the nanoparticle color remains substantially the same), when nanoparticles formed from electrical conductors aggregate both the color and the intensity of light scattering increases (i.e., the first and second optical characteristics of the display comprise different colors). For example dispersions of gold nanoparticles are typically ruby red. Aggregates of gold nanoparticles vary in color from purple to blue to black depending on the interparticle distance (U. Kreibig et al., Surf. Sci., 156, 678–800,1985 and W-H Yang et al., J. Chem. Phys. 703(5), 1995). Therefore the color of an electrophoretic display can be controlled by controlling the degree of aggregation of nanoparticles of conductors such as gold.

Nanoparticles of semiconductors have strong particle size dependent colors in both the dispersed and aggregated states. The colors are best and most easily seen in fluorescence, and are due to the size dependent quantization of electronic levels in the nanoparticles. The smaller the particles, the larger the band gap and the shorter the wavelength of the fluorescence. Examples of such nanoparticles of semiconducting materials are cadmium selenides (see, for example, M. G. Bawendi, Solid State Comm., 107(11), 709 (1998)). These particles have fluorescent peaks that vary smoothly from 400 nm (blue) to 700 nm (red) as the nanoparticle size varies from about 1.2 nm to 11.5 nm (C. B. Murray et al., JACS, 115(19), 8709 (1993)).

When semiconductor nanoparticles such as cadmium selenides are synthesized, the surfaces of the particles are generally treated with organic layers such as a trialkylphosphine or trialkylphosphine oxide. The presence of this surface treatment provides a barrier to flocculation of the nanoparticles so that the dispersion of the nanoparticles is colloidally stable and the particles stay uniformly distributed in the fluid for an extended period. Typically these nanoparticles dispersions are nearly monodisperse. This leads to pure colors. Mixtures of monodisperse semiconducting nanoparticles of different sizes produce fluorescent colors that are approximately the weighted averages of the monodisperse dispersions.

When monodisperse dispersions of semiconducting nanoparticles are aggregated into dense phases the organic surface layers prevent particles from coming into intimate contact. Therefore the aggregation-does not-change the intensity of the fluorescence color. However, when differently sized semiconducting nanoparticles are aggregated, the color changes to substantially that of the larger particle, that is the longer wavelength color. This is explained by the long range exchange of energy from the higher energy states in the smaller particles to the lower energy states in the larger particles. Therefore aggregation of semiconducting nanoparticles of different wavelengths produces a change in color (C. R. Kagan et al., Phys. Rev. Lett, 76(9), 1517–1520 (1996)).

Other optical effects can be achieved by a combination of fluorescing nanoparticles of semiconductors and nanoparticles of insulators. For example the aggregation of titania nanoparticles (insulators) with semiconducting cadmium sulfide nanoparticles (semiconductors) decreases the fluorescence of the semiconducting particles by the quenching of the fluorescent state by the insulating particles (H. Matsumoto et al., Langmuir, 17, 4283–4287(1995)).

The use of surface treatment of the nanoparticles to prevent unwanted aggregation of such particles in their dispersed state is of course not confined to semiconductor nanoparticles, nor is it confined to the specific surface treating agents already mentioned. For example, gold nanoparticles could be stabilized by a polymeric coating, thereby enabling two sets of gold nanoparticles bearing charges of opposite polarity to be dispersed in a hydrocarbon solvent to form an electrophoretic display of the present invention, as described in more detail below. In such a case, the gold nanoparticles might typically be about 10 nm in diameter and the polymeric coating might have a thickness of about 10 nm. Titania or other insulator nanoparticles could be provided with polymeric or other coatings for similar purposes. Coating or chemical treatment of the surfaces of the nanoparticles can also be used to adjust the electrophoretic mobility of the nanoparticles.

In nanoparticle assemblies of the present invention which rely upon changes in the electrical conductivity of the tether to change the optical characteristics of the assembly, the requirements for nanoparticle materials are naturally more stringent than for other types of nanoparticle assembly. In such assemblies, the nanoparticles may be formed from electrically conductive materials since such conductive materials will exhibit a substantial change in optical state for any given care in the conductivity of the tether. Examples of suitable conductors include most metals, especially silver, gold, platinum, palladium and alloys of these metals. Nanoparticles formed of semiconductors ("quantum dots"), for example cadmium sulfide or selenide may also be used, since certain properties of such nanoparticles, especially their fluorescent properties, are sensitive to the conductivity the tether in a variable conductivity nanoparticle assembly of the present invention.

The nanoparticles used in the present invention need not be spherical or even essentially spherical. Variations in the properties of the nanoparticle displays can be achieved using non-spherical and composite particles, for example particles in which a core of one material is surrounded by a shell of a different material, and the present invention extends to nanoparticle displays and assemblies using such non-spherical and/or composite particles.

The non-spherical nanoparticles used in the present invention (which will typically be formed in whole or part from electrically conductive materials) may have a wide variety of shapes. For example, such particles may have the form of ellipsoids, which may have all three principal axes of differing lengths, or may be oblate or prolate ellipsoids of revolution. The non-spherical nanoparticles may alternatively be laminar in form, the term "laminar" being used herein in a broad sense to indicate bodies in which the maximum dimension along one axis is substantially less than the maximum dimension along each of the other two axes; thus, such laminar nanoparticles may have a form similar to the tabular silver halide grains well known in photographic films. The non-spherical nanoparticles may also have the form of frusta of pyramids or cones, or of elongate rods. Finally, the nanoparticles may be irregular in shape.

Composite (core/shell) nanoparticles used in the present invention may have any of the forms discussed in the preceding paragraph, and will typically comprise an electrically conductive shell around an insulating core, or an electrically insulating shell around a conductive core. An insulating core may be formed from, for example, silicon, titania, zinc oxide, aluminum silicates, various inorganic salts, or sulfur.

Like the simple nanoparticles discussed above, the composite nanoparticles may be subjected to surface modification, for example to control the degree to which particles adhere to one another or to any surface with which they into contact during operation of the nanoparticle display. One preferred type of surface modification is attachment of polymers to the surfaces of the nanoparticles.

In at least some cases, the optical properties of the nanoparticles in either or both of their dispersed and aggregated forms are substantially affected by the shape as well as by the size of the nanoparticles. Also, in composite nanoparticles of the core/shell type, the optical properties are affected by the relative dimensions of the core and shell, as described for example in Oldenburg et al., Nanoengineering of Optical Resonances, Chem. Phys. Lett., 288,243 (1998).

As already indicated, in the electrophoretic display of the present invention, the electrophoretic medium may or may not be encapsulated, although it is generally preferred that the medium be encapsulated for reasons previously discussed. An encapsulated medium may conveniently have a plurality of microcapsules having diameters in the range of from about 10 to about 500 μm. Encapsulated media are also convenient for application to a variety of substrates, including flexible substrates, by printing techniques.

Use of the word "printing" is intended to include all forms of printing and coating, including, but without limitation: pre-metered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; and other similar techniques. Thus, the resulting display can be flexible. Further, because the display media can be printed (using a variety of methods), the manufacturing cost of the display can be reduced.

The suspending fluid used in the present invention is desirably a high resistivity fluid, and may or may not be colored depending upon the exact type of system used; the color could take the form of conventional large (i.e., not nanoparticle-sized) pigment particles suspended in the fluid, although a dye dissolved in the fluid is typically more convenient. The suspending fluid may be a single fluid, or it may be a mixture of two or more fluids. The suspending fluid may have its density substantially matched to that of the particles within the capsule. The suspending fluid may be a halogenated hydrocarbon, such as tetrachloroethylene, for example. The halogenated hydrocarbon may also be a low molecular weight polymer. One such low molecular weight polymer is poly(chlorotrifluoroethylene). The degree of polymerization for this polymer may be from about 2 to about 10.

As will be apparent to those skilled in art of electrophoretic displays, it is necessary to provide two electrodes adjacent the electrophoretic medium in order to apply the necessary electric field to the medium. However, only one electrode need be a permanent feature of the present display; the second electrode could have the form of a hand-held stylus or similar device which is brought near the medium only where it is desired to change the state of the medium. More often, however, the present electrophoretic display will have at least two permanent electrodes. These electrodes may be disposed upon opposed sides of the nanoparticle-containing fluid, in which case at least one of the electrodes should be substantially transparent to provide a viewing surface through which the nanoparticle-containing fluid can be viewed. Alternatively, both electrodes can be disposed on the same side of the nanoparticle-containing fluid so that the opposed side of the nanoparticle-containing fluid constitutes a viewing surface through which the nanoparticle-containing fluid can be viewed. Having both electrodes on the display facilitates forming an all-printed device. Especially when both electrodes are present on the same side of the electrophoretic medium, the two electrodes may differ in size to permit the nanoparticles to be aggregated in regions of differing size (cf., for example, the aforementioned U.S. Pat. No. 6,177,921, FIGS. 1A–1C, 2A–2D and 3A–3D, and the related description).

As will be apparent from the foregoing description, the present invention encompasses several different methods for changing the state of aggregation of the nanoparticles. These methods include:

1. Forming aggregates from multiple dispersed nanoparticles;
2. Separating aggregates of oppositely-charged particles under the influence of an electric field;
3. Forming units each comprising a plurality of nanoparticles attached to a single substrate such that, upon application of an electric field to the units, the distances between the nanoparticles within the unit will change, thereby changing the optical characteristic displayed by the unit; and
4. Attaching charged nanoparticles to a fixed body via a flexible filament such that, upon application of an electric field to the nanoparticles, the spacing between the nanoparticles and the fixed body will vary.

(The foregoing list of methods is not intended to be exclusive and other methods of causing changes in the aggregation of nanoparticles could be used. For example, the electric field could bring about a change in pH, or generate a particular ion, which could affect the conformation of a polymer in a manner similar to that discussed below with reference to FIGS. 6A, 6B, 7 and 8.)

Method 1 has already been discussed. An example of Method 2 would be forming a sol of two different types of gold particles (typically polymer-coated) bearing opposite charges. In the absence of an electric field, the two types of particles will form pairs comprising one particle of each type. If, however, a strong electric field is applied to the fluid, the particles in each pair will be forced apart, thereby changing the effective size of the gold particle and bringing about a color change in the manner already discussed.

Several variations of both Methods 3 and 4 are possible. For example, in Method 3, each unit might comprise two or more nanoparticles connected by a flexible filament. Alternatively, the unit might comprise an elongate flexible filament having one end attached to a fixed body and having an electrically charged body affixed at or adjacent its opposed end, the filament having a plurality of nanoparticles fixed thereto at spaced intervals between the fixed body and the electrically charged body, such that upon application of an electric field to the unit, the spacing between the fixed body and the electrically charged body will change, thereby changing the distances between the nanoparticles. The unit may also comprise an elongate flexible filament having one end attached to a first electrically charged body and its opposed end attached to a second electrically charged body bearing a charge of opposite polarity to the first electrically charged body, the filament having a plurality of nanoparticles fixed thereto at spaced intervals between the two electrically charged bodies, such that upon application of an electric field to the unit, the spacing between the two electrically charged bodies will change, thereby changing the distances between the nanoparticles.

As discussed further below, in a system containing a plurality of such nanoparticle units, the filaments of the various units could be physically or chemically linked to each other to form a gel. Application of an electric field to such a gel would cause the gel to contract, this changing the distances between the nanoparticles and thus the optical characteristic of the system.

An example of Method 4 would be a system in which at least some of the nanoparticles bear an electrical charge and are attached via flexible filaments to a fixed body, such that upon application of an electrical field to the nanoparticles the spacing between the nanoparticles and the fixed body will vary. If a large number of nanoparticles are tethered to a single fixed body in this way, changes in the applied electrical field will cause changes in the degree of "close-packing" of the nanoparticles, and hence color or light scattering changes in the manner already described.

The following considerations are applicable to the various applications of Methods, 3 and 4. The use of a substrate to which the nanoparticles are physically attached assists in controlling the spacing between the nanoparticles. For example, as already mentioned, for conducting nanoparticles, control of color depends on forming pairs or perhaps triplets, or on forming aggregates with a controlled interparticle distance. For semiconducting nanoparticles, control of color can be obtained if pairs of differently sized particles are formed. These goals may be accomplished by tethering the particles with polymers of controlled length. This idea has been shown to be effective with chromophore-quencher probes for DNA (N. B. Thorton et al., New J. Chem., 20, 791–800 (1996)).

Tethering particles of different sizes to each other is an aid to forcing the proper kinds of interparticle interactions to occur, say, that between a semiconducting particle and an insulating particle. Even better control of the interparticle spacing is obtained when the particles that are tethered to each other have electric charges. Particles with opposite electric charges can be separated by the application of an electric field. In the absence of an electric field, oppositely charged particles are drawn towards each other. The color of the pair will change depending on the interparticle distance and the interparticle distance can be controlled by a combination of proper polymer tether and application of an electric field.

An advantage of this tethered particle strategy is that the particles need only move a small distance, say on the order of a few particle diameters in order for the color to change. This small distance can be traversed quickly so that switching time of the display can be reduced substantially as compared with that of the prior art electrophoretic displays discussed above.

Nanoparticles tethered to a wall or other fixed object with a polymer can form small clusters when the electrical attraction between oppositely charged nanoparticles causes aggregation. With nanoparticles in a thin layer, the size of the clusters would be quite small, generally of the order of pairs. The application of an electric field would change the interparticle distances and hence the color of the display. Such nanoparticles tethered to a wall could be used in conventional unencapsulated electrophoretic displays; in encapsulated electrophoretic displays, the particles could alternatively be tethered to the capsule walls. Not only would the relevant color changes be fast since the particles need only move short distances before the color changes, the displays could be made relatively thin.

The tethering may be one nanoparticle to one nanoparticle, the particles being of opposite electric charge and different size or composition. The tethering could be many to one with many particles of one composition or of small size attached to a larger particle of the same composition (as in fluorescing nanoparticles of cadmium selenide).

The tethering could alternatively be that of many particles attached to a single polymer chain. Numerous uncharged nanoparticles could be attached to a polymer chain with a pair of oppositely charged particles (which need not be color producing) attached to the same chain in order to extend the chain and increase interparticle distance with the application of an electric field.

In a further embodiment of the invention, nanoparticles, all with the same sign charge could be tethered to an electrode. Application of an electric field forces the nanoparticles closer together or close to the electrode or both. Any of these changes in interparticle distance could change the color of the layer. Nanoparticles could be tethered to an electrode with polymers of a wide range of molecular weights. This "sea" of tethered nanoparticles could be forced into smaller interparticle spacing with the application of an electric field. Various magnitudes of electric field could produce different interparticle spacings and hence different colors, particularly gray scales.

One interesting embodiment of this type would have two sets of nanoparticles of opposite charge tethered to one side of the electrophoretic medium and have two sets of electrodes on the same side of the medium, the two sets of electrodes being interleaved (interdigitated). Application of opposing polarities to the two sets of electrodes would separate the two sets of particles, thus changing the appearance of the display. Such a display could be made extremely thin and could have a very short switching time.

The substrates and filaments used in the methods just described will typically be polymer chains. In the following description, such polymer chains will typically be described as if each nanoparticle is attached to a single polymer chain. However, in view of what has been said above, it will be appreciated that the important point for the functioning of the present electrophoretic displays is that strength of the relevant particle-particle or particle-electric field interactions are sufficient to vary the interparticle spacing so as to cause color changes. Accordingly, for practical purposes, it is irrelevant whether one or a plurality of polymer chains are used to link the nanoparticles together, and the latter may be preferred.

In nanoparticle assemblies of the present invention which rely upon changes in the electrical conductivity of the tether to change the optical characteristics of the assembly, the requirements for tether materials are naturally more stringent than for other types of nanoparticle assembly. In such assemblies, the tether may be formed of any material which can undergo a substantial change in electrical conductivity in a controllable manner. The tether may be formed from a polymer or oligomer. Preferred tethers include conducting electroactive oligomers, which can be switched between conducting and non-conducting states by reversible redox reactions. Such electroactive oligomers can include thiophene, pyrrole, furan, aniline, phenyl, ethynyl and pyridyl repeating units, and more than one type of repeating unit may be present in a single tether. In most cases, the redox reaction causes the electroactive oligomer to change between a non-conducting form, in which the unsaturated groupings in adjacent repeating units are not coplanar, and a conducting form in which these groupings are coplanar. A preferred oligomer is a polythiophene oligomer.

Also, in such variable conductivity nanoparticle assemblies, the optimum length of the tether will typically differ from that in nanoparticle assemblies which do not rely upon variable conductivity of the tether. In the non-variable conductivity nanoparticle assemblies, the tether needs to be long enough to permit the nanoparticles to move relative to each other by a distance which allows changes in the appearance of the assembly resulting from the physical separation between the particles, and this distance is of the same order of magnitude as the diameter of the nanoparticles themselves, typically around 50 nm. In contrast, in the variable conductivity nanoparticle assemblies, the tether may be regarded as acting as a "molecular transistor", and hence need only be long enough to ensure that in its non-conducting state, it effectively insulates the particles in the assembly from one another, and this can be achieved using as the tether an oligomer containing only a small number of repeating units. For example, calculations indicate that polythiophene oligomers containing as few as 3 to 5 repeating units can function satisfactorily in the present assemblies. Such oligomers have lengths not greater than about 2 nm.

Many of the variable conductivity nanoparticle assemblies of the present invention can achieve the display of gray scale, since the conductivity of many oligomers and other tethers can be varied continuously be controlling redox potential within the medium surrounding the tether, and the resultant continuous variation in conductivity of the tether will provide intermediate conductivity values and corresponding intermediate optical characteristics of the assembly between the two extreme optical characteristics associated with the non-conducting and conducting states of the tether.

Although the variable conductivity nanoparticle assemblies of the present invention rely upon the change in conductivity of the tether to achieve a change in optical characteristics, we do not exclude the nanoparticles assemblies might, in addition, undergo a change in optical characteristics resulting from changes in conformation or length of the tether, with resulting changes in the distance between the particles of the assembly.

In the nanoparticle assemblies of the present invention, it is not essential that the nanoparticles remain attached to the tethers at all times. For example, in some embodiments of the invention, the electrical charges on the nanoparticles and the tether could be such that the nanoparticles would be attached to the tethers when the tether is in its conductive state, but the nanoparticles could detach from the tether when this tether is in its non-conductive state. Also, in some cases the nanoparticles could equilibrate between bound and unbound states. However, in many embodiments of the invention, the tether will be securely bonded to the particles. Preferably, this firm anchoring is effected by chemical grafting of the polymer chain to the nanoparticle surface with one or more chemical bonds. However, the necessary anchoring may in some cases be achieved by acid-base interactions, by physical adsorption forces, by solvation forces or by any combination of these forces provided the strength of the resultant anchoring is sufficient to withstand any disruption to which it is subject due to applied electric fields and/or viscous forces as the nanoparticles move through the fluid.

Methods for chemically bonding oligomers to nanoparticles and macroparticles are known, and any of the known methods capable of producing stable bonds may be employed. In the case of metal nanoparticles, one useful technique for producing such stable bonds is to provide a thiol group on the tether; such a thiol group will react with a gold, silver, platinum or palladium surface to form a sulfide linkage between the tether and the surface, as described for example in:

Korgel, B. A., et al., *J. Phys. Chem. B* 7998, 102, 8379–8388; and

Storhoff, J. J., et al., *J. Am. Chem. Soc.* 2000, 122, 4640–4650.

Phenylene and ethynylene oligomers may also be bonded to silver and gold nanoparticles via sulfide groups; see, for example:

Novak, J. -P. et al., *J Am. Chem. Soc* 2000, 122, 39,79–3980; and

McConnell, W. P., et al.,*J. Phys. Chem.* 92000, 104, 8925.

Tethers may also be bonded to gold, silver, platinum and palladium surfaces by means of oxide or amine groups; see, for example:

Esumi, K., et al., *Langmuir,* 2000, 76, 2604–2608.

As already mentioned, polymers grafted to the nanoparticle surface are most firmly held. Polymers that can bind to the nanoparticle surface via multiple attachment sites are usually more firmly held than polymers having only a single attachment site. The attachment of the polymer can be by chelation of active groups on the polymer to ions or other attachment sites on the nanoparticle surface. The attachment can also be by electrostatic forces.

At least in non-variable conductivity nanoparticle assemblies, an important property of the polymers used as tethers is their elasticity. The polymer must be sufficiently flexible to permit close nanoparticle—nanoparticle approach in one display state and yet allow large nanoparticle—nanoparticle separations to achieve a second display state upon the application of an electric field. The elasticity of polymers varies with the chemistry of the polymer and with the interaction between the polymer and the fluid in which it is immersed. In general, when the polymer interactions with the fluid are weak, the polymer tends to collapse in upon itself; on the other hand, when the polymer-fluid interactions are stronger, the polymer tends to assume a longer, more extended from. Thus, the separation between nanoparticles can be changed not only by the application of electric forces but by changes in polymer/fluid solvation forces.

Such solvation forces can be varied by changing the composition of the fluid, for example by the addition or removal of a component which is a non-solvent for the polymer. Solvation forces can also be changed by the addition of species that modify the polymer itself, such as acids and bases. Solvation forces also change with temperature.

The electrophoretic display of the present invention can operate in either a transmissive or a reflective mode. For example, if the electrophoretic medium is of the type previously described using insulating nanoparticles which are essentially non-light-scattering in their disperse state (so that the medium is substantially transparent) but light-scattering in the aggregated state (so that the medium is substantially opaque), the electrophoretic display may have a viewing surface through which the nanoparticle-containing fluid can be viewed, and on the opposed side of the display from the viewing surface, a light source arranged to pass light through the nanoparticle-containing fluid. The electrophoretic medium can thus act as a light valve, or as a privacy window; a microencapsulated electrophoretic medium of this type could be used to print large area privacy windows at relatively low cost per unit area.

Alternatively, using the same type of light-scattering/non-light-scattering electrophoretic medium, the surface of the display opposite the viewing surface could be reflective or colored. When the medium is in its non-light-scattering (transparent) state, an observer looking at the viewing surface will see the reflective or colored rear surface of the display, whereas when the medium is in light-scattering mode, the observer will see the color of the medium itself, the reflective or colored rear surface being obscured. The reflective surface used in this type of display may be, for example, a specular mirror, a textured gain reflector, a holographic reflector or a diffraction grating. Particularly when used with directional lighting, a large contrast can be obtained between the two states of the display. If the rear surface of such a display is patterned with differing colors, multiple color or full color displays can be achieved.

As already indicated, variable conductivity nanoparticle assemblies may be of any of the types (a), (b), (c) and (d) mentioned above. In the case of a type (c) variable conductivity nanoparticle assembly, in which a plurality of nanoparticles are attached via tethers to a macroscopic object such as an electrode, it is not essential that the tethers be of differing lengths. In non-variable conductivity type (c) assemblies, tethers of differing lengths are required so that, when the nanoparticles are not in their close-packed configuration, the nanoparticles can be spaced from one another by the distances needed to ensure the optical characteristics expected in the non-close-packed configuration. However, in similar variable conductivity assemblies, the optical characteristics of the nanoparticles depend upon the conductivity of the tethers, not the spacing between the particles. Accordingly, provided that a sufficient change in display state can be achieved using a single layer of nanoparticles on an electrode or similar object, the tethers of all the nanoparticles can have the same length.

In variable conductivity nanoparticle assemblies, to facilitate switching of the tethers of the nanoparticle assemblies between their first and second states, the nanoparticle assemblies may be dispersed in a thin film of solvent or gel, either of which contains an electrolyte. This film of solvent or gel may then be sandwiched between two electrodes, at least one of which is substantially transparent; such electrodes are conveniently formed by depositing indium tin oxide (ITO) on a transparent substrate, such as glass sheet or a plastic sheet or flexible film. Alternatively, such an ITO electrode may be replaced by one formed from a conducting polymer or a conducting polymer/non-conducting polymer composite, such as that sold under the trade name BAYTRON D by Bayer Corporation. In such a medium, the tethers of the nanoparticle assemblies may be electrochemically switched between their non-conducting, fully-reduced neutral state and their oxidized, conducting state. The structure of a display of the present invention may thus be similar to that described in Sapp, S. A. et al., *Chem. Mater.* 1998, 10, 2101.

Figure 2A:
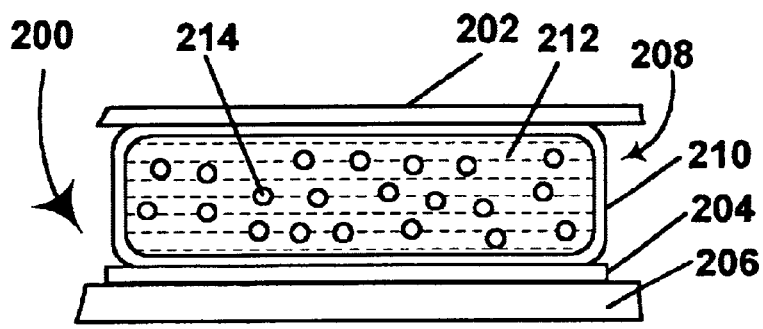
FIGS. 2A–2C are schematic side elevations showing various states of a first electrophoretic display of the present invention comprising a single type of nanoparticle in a colored fluid.

FIG. 2A of the accompanying drawings is a schematic side elevation, generally similar to that of FIG. 1, of an encapsulated electrophoretic display (generally designated 200) of the present invention having a single type of charged nanoparticle (assumed for present purposes to be negatively-charged, though obviously a positively-charged nanoparticle could equally well be used) dispersed in a colored fluid. FIG. 2A shows only a single pixel of the display, and for the same reasons as in FIG. 1, shows only a single microcapsule forming this pixel, although in practice a large number of microcapsules (20 or more) would be used for each pixel.

The electrophoretic display 200 comprises a common, transparent front electrode 202 which forms the viewing surface through which an observer views the display, and a plurality of discrete rear electrodes 204, each of which defines one pixel of the display (only one electrode 204 is shown in FIG. 2A). The rear electrodes 204 are mounted upon a substrate, 206. The rear electrodes 204 preferably have a highly reflective upper surface (as shown in FIG. 2A); alternatively, the rear electrode 204 may be transparent and the substrate 206 be provided with a highly reflective upper surface.

The electrophoretic display 200 further comprises an encapsulated electrophoretic medium comprising microcapsules 208 having microcapsule walls 210 encapsulating a dyed liquid 212. A plurality of nanoparticles 214 are uniformly dispersed throughout the liquid 212. In a preferred form of this electrophoretic display, the nanoparticles 214 comprise titania particles, negatively charged and having a diameter of about 10 nm, while the liquid 212 comprises a hydrocarbon having dissolved therein a blue dye.

FIG. 2A shows the display 200 in its condition when no field is applied across the electrodes 202 and 204. Since the nanoparticles 214 are not subject to any applied field, they remain uniformly dispersed throughout the liquid 212 and, since they are substantially smaller in diameter than the wavelengths of visible light, the nanoparticles are essentially non-light-scattering and appear transparent. Accordingly, an observer viewing the display from above (in FIG. 2A) sees the color caused by light passing through the dyed liquid 212, reflecting from the rear electrode 204 (or substrate 206 depending upon which integer bears the reflective surface), and passing back through the dyed liquid 212.

Figure 2B:
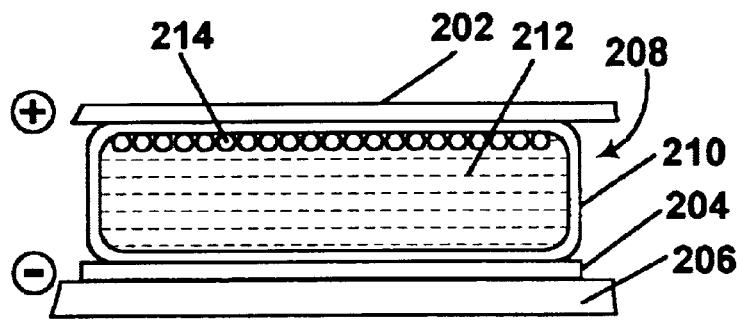

FIG. 2B shows the state of the same electrophoretic display 200 when a positive potential is applied to the front electrode 202 and a negative potential to the rear electrode 204. The resultant electric field causes the nanoparticles 214 to aggregate adjacent the front electrode 202, so that the observer sees the color of the aggregated nanoparticles 214 (white in the case of the preferred titania nanoparticles).

Figure 2C:
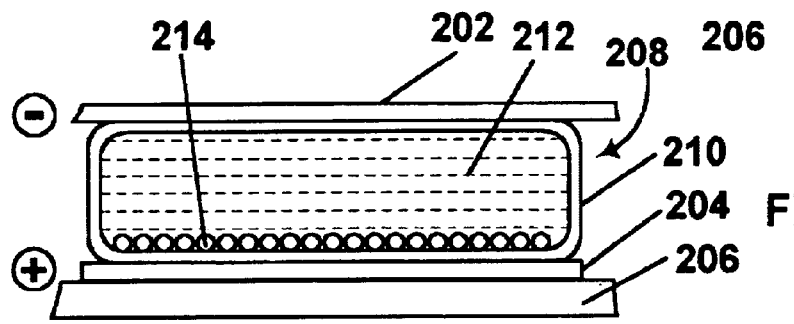

FIG. 2C shows the state of the same electrophoretic display 200 when a negative potential is applied to the front electrode 202 and a positive potential to the rear electrode 204. The resultant electric field causes the nanoparticles 214 to aggregate adjacent the rear electrode 204, so that the observer sees the color caused by light passing through the dyed liquid 212, scattering from the aggregated particles 214, and passing back through the dyed liquid 212. Note that this color is not the same as that produced in FIG. 2A, where reflection occurs from the rear electrode 204 or substrate 206. Thus, the display 200 shown in FIGS. 2A–2C is capable of displaying three different colors, in contrast to a similar display using conventional large pigment particles in place of the nanoparticles 214; in effect, the conventional display using large pigment particles lacks any state comparable to that shown in FIG. 2A, in which the nanoparticles are in a non-light-scattering dispersed condition and effectively "disappear" from the display.

The display 200 shown in FIGS. 2A–2C may be modified by replacing the reflective surface on the rear electrode 204 or substrate 206 with a black, non-reflective surface. In the condition shown in FIG. 2A, the observer then sees the black color of the rear surface, thus providing three completely different colors depending upon the state of the display.

As already indicated, the display 200 can be changed from the condition shown in FIG. 2A to that shown in FIG. 2B or 2C by applying the appropriate direct current electric field. The reverse change is conveniently effected by applying, via the electrodes 204 and 206, an alternating current field of a sufficient frequency, which is typically of the order of tens of Hertz or higher. Alternatively a pulsed direct current field may be used to disperse the nanoparticles.

It will be seen that, in the state shown in FIG. 2B, the nanoparticles effectively form a single flat layer adjacent the electrode 202. At least in theory, if the single layer of microcapsules 208 shown in FIGS. 2A–2C were replaced by multiple layers of very small microcapsules having the same thickness, this thickness being of the same order as the wavelengths of visible light, in the state corresponding to that of FIG. 2B, the nanoparticles would form a series of flat, parallel planes spaced by regular spacings of the same order as the wavelengths of visible light. Such a structure could serve as a diffraction grating.

Figure 3A:
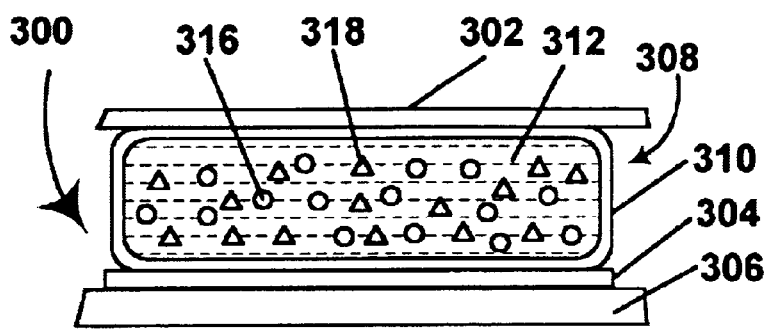
FIGS. 3A–3C are schematic side elevations, similar to those of FIGS. 2A–2C respectively, showing various states of a second, single layer electrophoretic display of the present invention comprising two types of nanoparticle in a colored fluid.

FIG. 3A shows a single layer electrophoretic display (generally designated 300) of the present invention which uses microcapsules 308 comprising two different types of nanoparticles 316 and 318 having charges of the same polarity (assumed for present purposes to be negative) but different electrophoretic mobilities, the mobility of nanoparticles 316 being highly than that of nanoparticles 318. The nanoparticles 316 and 318 also differ in color when aggregated; for example, the nanoparticles 316 could be red when aggregated and the nanoparticles 318 blue. Also, the fluid 312 in the microcapsules 308 is uncolored, and the rear electrode 304 is colored with a color (say green) which differs from the colors of both the aggregated nanoparticles 316 and 318; alternatively, the rear electrode 304 could be transparent and the green color provided on the substrate 306.

Figure 3B:
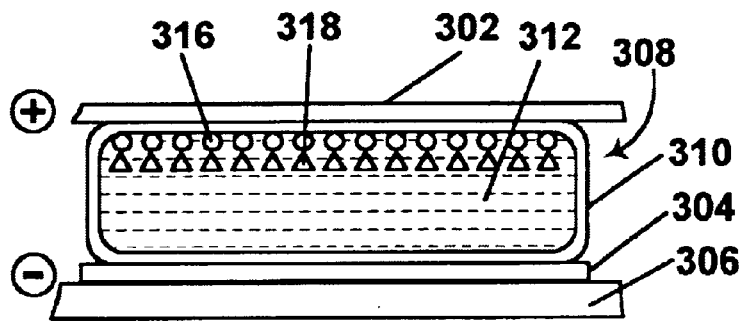
Figure 3C:
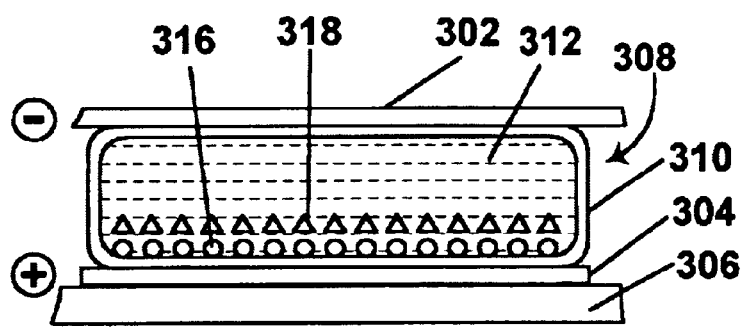

The single layer electrophoretic display shown in FIGS. 3A–3C has three separate display states which differ in at least one optical characteristic, namely color. In the first display state shown in FIG. 3A, no field is applied across the electrodes 302 and 304. Since the nanoparticles 316 and 318 are not subject to any applied field, they remain uniformly dispersed throughout the liquid 312 and, since they are substantially smaller in diameter than the wavelengths of visible light, the nanoparticles are essentially non-light-scattering and appear transparent. Accordingly, an observer viewing the display from above (in FIG. 3A) sees the color (green) of the rear electrode 304.

FIG. 3B shows the second display state of the same electrophoretic display 300 when a positive potential is applied to the front electrode 302 and a negative potential to the rear electrode 304. The resultant electric field causes the nanoparticles 316 and 318 to aggregate adjacent the front electrode 302, but since the nanoparticles 316 have the higher electrophoretic mobility, they will reach the electrode 302 first and the observer will see the color (red) of the aggregated nanoparticles 316.

FIG. 3C shows the third display state of the same electrophoretic display 300 when a negative potential is applied to the front electrode 302 and a positive potential to the rear electrode 304. The resultant electric field causes the nanoparticles 316 and 318 to aggregate adjacent the rear electrode 304, but since the nanoparticles 316 have the higher electrophoretic mobility, they will reach the electrode 304 first, leaving a layer of aggregated nanoparticles 318 facing the front electrode 302 so that the observer sees the color (blue) of this later of aggregated nanoparticles 318.

Thus, each pixel of the display 300 is capable of displaying a red, green or blue color, and thus the color saturation obtainable from such a display is markedly greater than that from a conventional electrophoretic display using filters, as discussed above.

It will readily be apparent of those familiar with electrophoretic displays that the display 300 could be modified by using two sets of nanoparticles bearing charges of opposite polarity rather than two sets bearing charges of the same polarity but have different electrophoretic mobilities. For example, if the nanoparticles 316 remained negatively charged but the nanoparticles 318 were positively charged, the visual appearance of the three display states shown in FIGS. 3A–3C would be unchanged, but in FIG. 3B the nanoparticles 318 would lie adjacent the rear electrode 304, while in FIG. 3C the nanoparticles 318 would lie adjacent the front electrode 302.

The display shown in FIGS. 3A–3C may be modified by replacing the colored rear surface on the electrode 304 or substrate 306 with a reflective surface and by incorporating a dye into the liquid 312. When this modified display is in the condition shown in FIG. 3A, the color seen by the observer is that resulting from light passing through the dyed liquid 312, reflecting from the rear electrode 304 and passing back through the dyed liquid 312, i.e., the observer sees simply the color of the dyed liquid.

As with the display 200, the display 300 can be changed from the condition shown in FIG. 3A to that shown in FIG. 3B or 3C by applying the appropriate direct current electric field. The reverse change is conveniently effected by applying, via the electrodes 304 and 306, an alternating current field of a sufficient frequency, which is typically of the order of tens of Hertz or higher. Alternatively a pulsed direct current field may be used to disperse the nanoparticles.

As already noted, providing the suspending fluid is not colored, the types of displays shown in FIGS. 2A–2C and 3A–3C possess a state (shown in FIGS. 2A and 3A) in which the microcapsules are transparent, so that the display can act as a light valve or shutter. Thus, a medium (electrophoretic layer) of the present invention can be used as a light valve or shutter in conjunction with any known type of electro-optic medium to increase the number of display states which can be obtained from each pixel of the electro-optic medium. The electro-optic medium could, for example, be of the rotating bichromal member type as described, for example, in U.S. Pat. Nos. 5,808,783; 5,777,782; 5,760,761; 6,054,071; 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Other types of electro-optic materials, for example, liquid crystal, especially polymer-dispersed and/or reflective liquid crystal, electro-optic media, for example suspended rod-shaped particle devices, may also be used; see Saxe, Information Display, April/May 1996 (Society for Information Display), and U.S. Pat. No. 4,407,565.

Figure 10A:
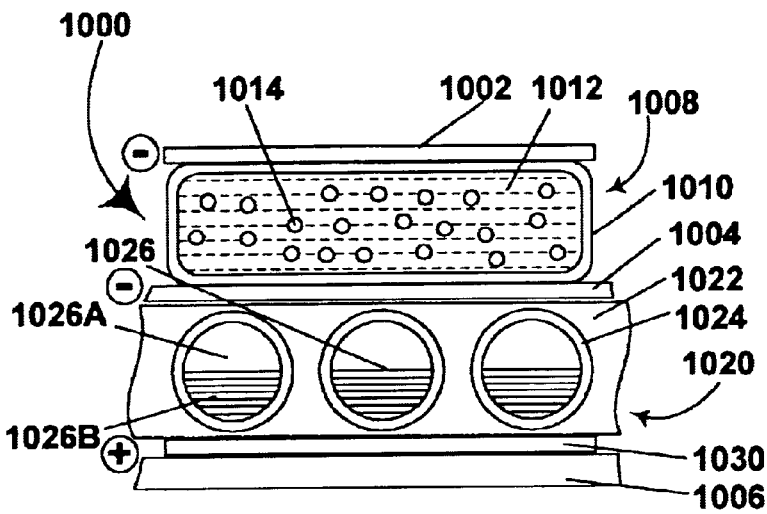
FIGS. 10A–10C illustrate the three display states of a first double layer electronic display of the invention.
Figure 10B:
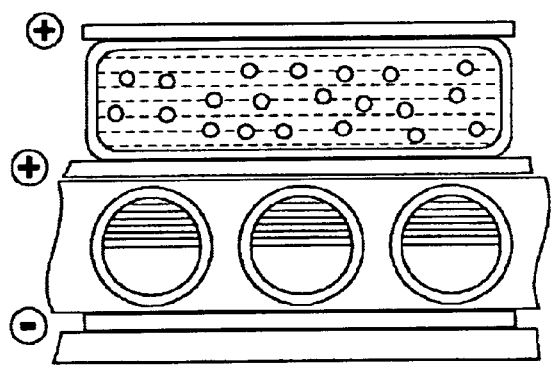
Figure 10C:
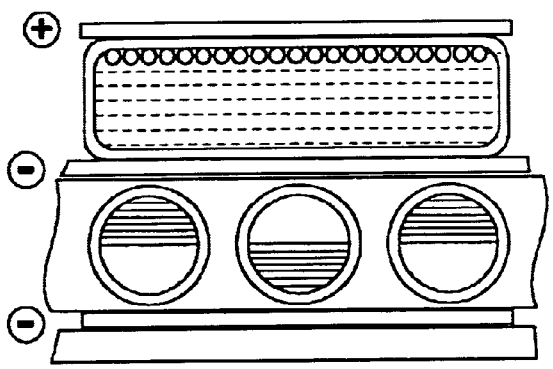

A simple example of this type of double layer display of the invention is illustrated in FIGS. 10A–10C. The display (generally designated 1000) comprises a plurality of discrete, transparent first electrodes 1002, each of which defines one pixel of the display (only one electrode 1002 is shown in FIGS. 10A–10C), and which together form a viewing surface through which an observer views the display. The display 1000 further comprises a common, transparent second electrode 1004 and, between the first electrodes 1002 and the second electrode 1004, an encapsulated electrophoretic medium comprising microcapsules 1008 having microcapsule walls 1010 encapsulating an uncolored liquid 1012. A plurality of nanoparticles 1014 are dispersed through the liquid 1012; for purposes of illustration, it will be assumed that the nanoparticles 1014 are red when aggregated. Thus, the front layer of the display 1000, comprising the electrodes 1002 and 1004 and the microcapsules 1008, is substantially similar to the electrophoretic display 200 shown in FIGS. 2A–2C, except that the liquid 1012 is uncolored (so that the front layer can act as a light valve), and that the positions of the discrete and common electrodes are reversed.

On the opposed side (the lower side in FIGS. 10A–10C) of the second electrode 1004 is disposed a bichromal rotating ball layer (generally designated 1020) of the type described in the aforementioned U.S. Pat. Nos. 5,808,783; 5,777,782; 5,760,761; 6,054,071; 6,055,091; 6,097,531; 6,128,124; 6,137,467; and 6,147,791. The bichromal rotating ball layer 1020 comprises a continuous polymeric matrix 1022 within which are disposed a plurality of oil-filled spherical cavities 1024. Each cavity 1024 contains a single sphere 1026 having a first hemisphere 1026A and a second hemisphere 1026B, these hemispheres differing in color. Each sphere 1026 is rotatable within its associated cavity 1024 and has an internal dipole aligned normally to the plane between its hemispheres 1026A and 1026B, so that when the sphere 1026 is placed in an electric field, its dipole aligns with the field and the plane between its hemispheres 1026A and 1026B lies perpendicular to the field. For purposes of illustration, the hemispheres 1026A are assumed to be white, the hemispheres 1026B are assumed to be black and the dipoles oriented such that the black hemispheres 1026B point towards to more positive end of the field.

On the opposed side of the bichromal rotating ball layer 1020 from the second electrode 1004 are disposed a plurality of third electrodes 1030 (only one of which is shown in FIGS. 10A–10C), each of which is aligned with one of the first electrodes 1002, and a substrate 1006. (For reasons which will readily be apparent to those skilled in electrical driving of displays, only one continuous electrode and two sets of discrete electrodes are required to achieve independent driving of each pixel in each of the two optically-active layers; there is no need for a second continuous electrode.)

Each pixel of the display 1000 is capable of three display states, as follows:

(a) a first, white state, as shown in FIG. 10A, in which the third electrode 1030 is made positive relative to the second electrode 1004, so that the white hemispheres 1026A face the second electrode 1004, while the first electrode 1002 is maintained at the same potential as the second electrode 1004, so that the nanoparticles 1014 are not aggregated, the microcapsules are transparent, and the white hemispheres 1026A are thus visible through the viewing surface;

(b) a second, black state, as shown in FIG. 10B, in which the third electrode 1030 is made negative relative to the second electrode 1004, so that the black hemispheres 1026B face the second electrode 1004, while the first electrode 1002 is maintained at the same potential as the second electrode 1004, so that the nanoparticles 1014 are not aggregated, the microcapsules are transparent, and the black hemispheres 1026B are thus visible through the viewing surface; and (c) a third, red state, as shown in FIG. 10C, in which an electric field is applied between the first and second electrodes 1002 and 1004 so that the nanoparticles 1014 aggregate adjacent one of the electrodes 1002 and 1004 (adjacent electrode 1002 in FIG. 10C) and are thus visible through the viewing surface; in this state, the positions of the rotating spheres 1026 are irrelevant since the spheres 1026 are hidden by the aggregated nanoparticles 1014., The three-state display shown in FIGS. 10A–10C may be used, for example to provide a black-on-white (or white-on-black) text display with the capability for red highlighting of-particular text. Such a three-state display might be modified to have red, green and blue display states with the capacity for producing color images.

The three-state display shown in FIGS. 10A–10C could also be modified by replacing the microcapsules 1008, containing only a single type of nanoparticle 1014 with a microcapsule similar to the microcapsule 308 shown in FIGS. 3A–3C and containing two different species of nanoparticles having different electrophoretic mobilities. This will produce a four-state display, the first two states being the same as described above with reference to FIGS. 10A–10C, the third state being one in which the first species of nanoparticles are aggregated and visible through the viewing surface (cf. FIG. 3B) and the fourth state being one in which the second species are aggregated and visible through the viewing surface (cf. FIG. 3C). Such a four-state display could, for example, have white, red, green and blue states and could thus be used for displaying color images on a white background, although it should be noted that where a black area is required, such a display would have to use a process black by intermingling red, green and blue pixels.

Thus, the present invention allows one to use multiple superimposed electro-optic layers to achieve more than three colors in each pixel. As is well known to those skilled in the imaging art, to achieve realistic full color images one must be able to control not only the color of each area of the image, but also the saturation of the color, and to do so one needs to be able to set various pixels not only to the three primary colors being used but also to black or white; note that conventional four-color CMYK printing on paper is in a reality a five-color system, the white color normally being supplied by unprinted areas of the white paper.

A comparable five-color system can be achieved using a "double-stacked" modification of the display shown in FIGS. 3A–3C, in which an additional layer of microcapsules and an additional layer of discrete, transparent electrodes similar to the discrete electrodes 304 are placed above the continuous electrode 302. The resultant preferred double layer display of the present invention is illustrated in FIGS. 11A–11E.

It is believed that the construction of the double layer display (generally designated 1100) shown in FIGS. 11A–11E will readily be apparent from the foregoing descriptions of displays 300 and 1000, and accordingly this construction will be summarized briefly as follows. The various components of the display 1100 are (reading from top to bottom in FIG. 11A):

(a) a plurality of discrete, transparent first electrodes 1102, each of which defines one pixel of the display 1100 and which together form a viewing surface through which an observer views the display; as before, only one first electrode 1102 is shown in FIGS. 11A–11E;

(b) a first encapsulated electrophoretic medium comprising microcapsules 1108 having microcapsule walls 1110 encapsulating an uncolored liquid 1112, a first species of nanoparticles 1116 (assumed, for purposes of illustration, positively charged and white when aggregated) and a second species of nanoparticles 1118 (assumed negatively charged and black when aggregated);

(c) a common, transparent second electrode 1104;

(d) a second encapsulated electrophoretic medium comprising microcapsules 1140 having microcapsule walls 1142 encapsulating an uncolored liquid 1144, a third species of nanoparticles 1146 (assumed positively charged and red when aggregated) and a fourth species of nanoparticles 1148 (assumed negatively charged and green when aggregated);

(e) a plurality of discrete, transparent third electrodes 1130 (only one of which is shown in FIGS. 11A–11E), each of which is aligned with one of the first electrodes 1102; and (f) a colored substrate 1106, assumed blue (if desired, the third electrodes 1130 can be made colored and opaque, in which case the color and transparency of the substrate 1106 is irrelevant, or the liquid 1144 in the microcapsules 1140 could be colored blue).

Figure 11A:
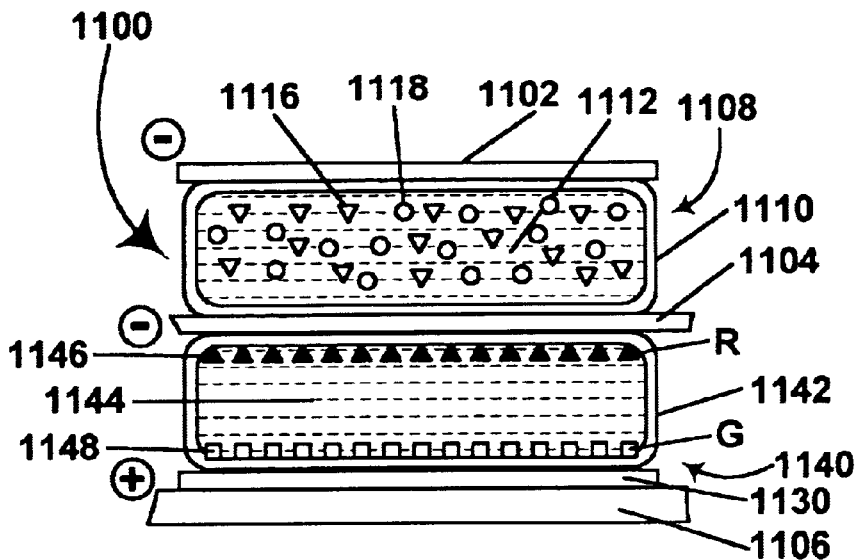
FIGS. 11A–11E illustrate the five display states of a second double layer electronic display of the present invention.
Figure 11B:
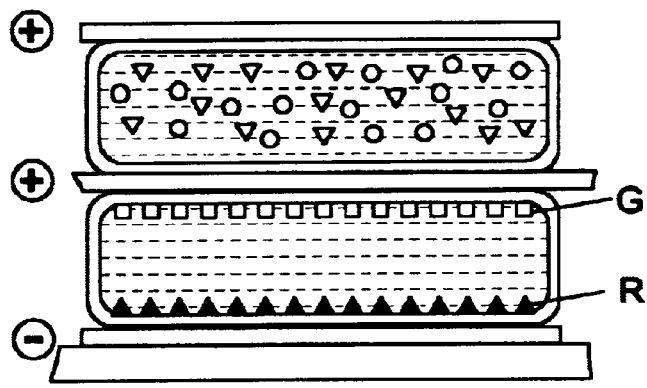
Figure 11C:
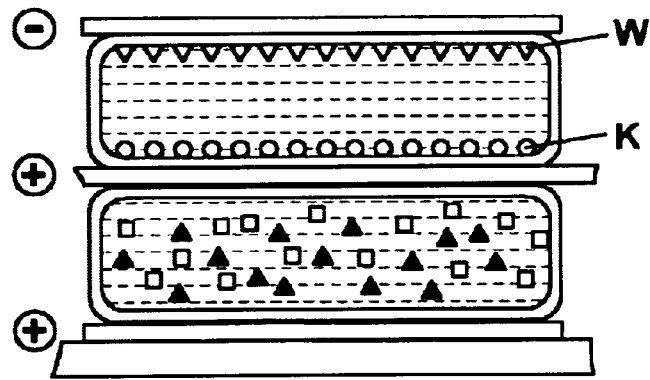
Figure 11D:
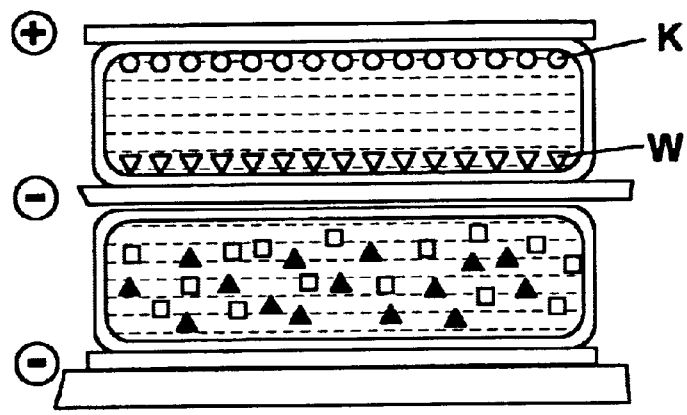
Figure 11E:
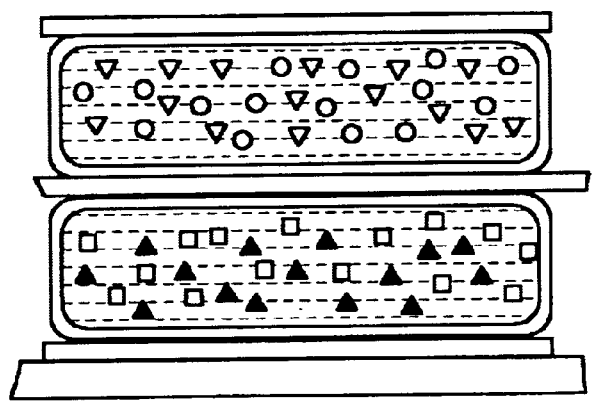

Each pixel of the display 1100 is capable of five display states as follows:

(a) a first, red state, as shown in FIG. 11A, in which the third electrode 1130 is made positive relative to the second electrode 1104, so that the nanoparticles 1146 form a red aggregate R adjacent the second electrode 1104, while the first electrode 1102 is maintained at the same potential as the second electrode 1104, so that the nanoparticles 1116 and 1118 are not aggregated, the microcapsules 1108 are transparent, and the red aggregate R of nanoparticles 1146 is thus visible through the viewing surface (in this state, the nanoparticles 1148 will form a green aggregate G adjacent the third electrode 1130, but this green aggregate will be hidden by the red aggregate formed by the nanoparticles 1146);

(b) a second, green state, as shown in FIG. 11B, in which the third electrode 1130 is made negative relative to the second electrode 1104, so that the nanoparticles 1148 form a green aggregate G adjacent the second electrode 1104, while the first electrode 1102 is maintained at the same potential as the second electrode 1104, so that the nanoparticles 1116 and 1118 are not aggregated, the microcapsules 1108 are transparent, and the green aggregate G of nanoparticles 1146 is thus visible through the viewing surface (in this state, the nanoparticles 1146 will form a red aggregate R adjacent the third electrode 1130, but this red aggregate will be hidden by the green aggregate formed by the nanoparticles 1148);

(c) a third, white state, in which the first electrode 1102 is made negative relative to the second electrode 1104, so that the nanoparticles 1116 form a white aggregate W adjacent the first electrode 1102, and this white aggregate is visible through the viewing surface (in this state, the nanoparticles 1118 will form a black aggregate K adjacent the second electrode 1104 but this black aggregate will be hidden by the white aggregate formed by the nanoparticles 1116; also, in this state the distribution of the nanoparticles 1146 and 1148 within the microcapsules 1140 is irrelevant, since the microcapsules 1140 are also hidden by the white aggregate);

(d) a fourth, black state, in which the first electrode 1102 is made positive relative to the second electrode 1104, so that the nanoparticles 1118 form a black aggregate K adjacent the first electrode 1102 and this black aggregate is visible through the viewing surface (in this state, the nanoparticles 1116 will form a white aggregate W adjacent the second electrode 1104 but this white aggregate will be hidden by the black aggregate formed by the nanoparticles 1118; also, in this state the distribution of the nanoparticles 1146 and 1148 within the microcapsules 1140 is again irrelevant); and (e) a fifth, blue state in which the nanoparticles 1116 and 1118 are dispersed in the liquid 1112 and the nanoparticles 1146 and 1148 are dispersed in the liquid 1144, so that both the microcapsules 1108 and 1140 are transparent and the blue surface of the substrate 1106 is visible through the viewing surface.

It will be appreciated that the assignment of particular colors to particular states of the display 1100 is arbitrary and can be varied at will. For example, if the three states of each upper microcapsule 1108 are (say) transparent, red and blue, and the three states of each lower microcapsule 1140 are green, black and white, any given pixel of the display can still be set independently to any one of these five colors, thereby producing a color display capable of achieving controlled color saturation as well as full color. However, since the human eye is sensitive to slight changes of hue in a supposedly white color, and to traces of grayness in supposedly white or black colors, but is less susceptible to minor changes of hue in red, green and blue colors, it is generally desirable that, in displays similar to the display 1100, the microcapsule adjacent the viewing surface provide the white and black states, with the microcapsule further from the viewing surface providing the other three states. Also, of course, displays similar to the display 1100 can readily be adapted to provide white, black, yellow, cyan and magenta states instead of white, black, red, green and blue states.

It should be noted that the displays 200, 300, 1000 and 1100 already described are stable in all their display states, i.e., once the display has been driven, by application of electric fields to one or both optically active layers as already described, the state of the display will persist for a substantial period even after the electric fields have been turned off.

The substrate materials 1004 and 1104 separating the optically-active layers should be made as thin as possible in order to minimize parallax issues in the display. Flexible substrates, because of their rugged and thin form factor, are advantageous in these displays compared to glass substrate materials.

To change the display 200 or 300 from one colored image to another, it is convenient to apply the alternating field to all the pixels of the display, thereby restoring all pixels to the condition shown in FIG. 2A or 3A, an then the change the desired pixels as needed to display the new image. Note that the transitions 2A to 2B and 2A to 2C (and the analogous transitions for the display 300) can conveniently be effected simultaneously using a so-called "V/2" technique, in which the front electrode 202 is set to a voltage of +V/2, while the various electrodes 204 controlling the individual pixels are set to 0, +V/2 or +V, depending upon the desired state of the associated pixel. Similar techniques can of course be used in the displays 1000 and 1100.

The double layer displays of the present invention are illustrated in FIGS. 10A–10C and 11A–11E with only a transparent electrode between the two optically active layers. In some cases, no additional layer is necessary; for example, since the electrophoretic layers shown in FIGS. 11A–11E draw very little current, the second electrode 1104 could comprise a transparent layer of a conductive polymer, which might, for example, be applied from solution over a previously-formed electrophoretic layer, and dried to produce a continuous film of the polymer to form the second electrode 1104. If, however, it is desired that the second electrode 1104 be a thin metal layer, for example of indium-tin-oxide, it will normally be necessary to deposit the thin metal layer on a support (for example a thin polymer film) and thus to include this support between the two optically active layers. In this case, the support should be kept as thin as possible, since the support will lie between the second electrode and one of the optically active layers, so that the presence of the support will reduce the electric field across this optically active layer at any given operating voltage. (This reduction is electric field could be avoided by using a support with metal electrodes on both sides, but this is undesirable since indium-tin-oxide and similar electrode layers only transmit about 90% of the incident light, and introducing an additional metal layer into the structure in this way will adversely affect the brightness of the display.)

If a substrate is present adjacent the second electrode, it may be convenient to manufacture the display shown in FIGS. 11A–11E by starting from the metallized substrate which forms the second electrode, coating the two electrophoretic layers on either side of this metallized substrate and thereafter laminating the resultant structure to the first and third electrodes.

For similar reasons, although the double layer displays of the present invention are illustrated in FIGS. 10A–10C and 11A–11E with only transparent first electrodes forming the viewing surface, these first electrodes will typically be carried on a substrate, which can serve the additional function of protecting the upper optically active layer from mechanical damage.

Figure 4:
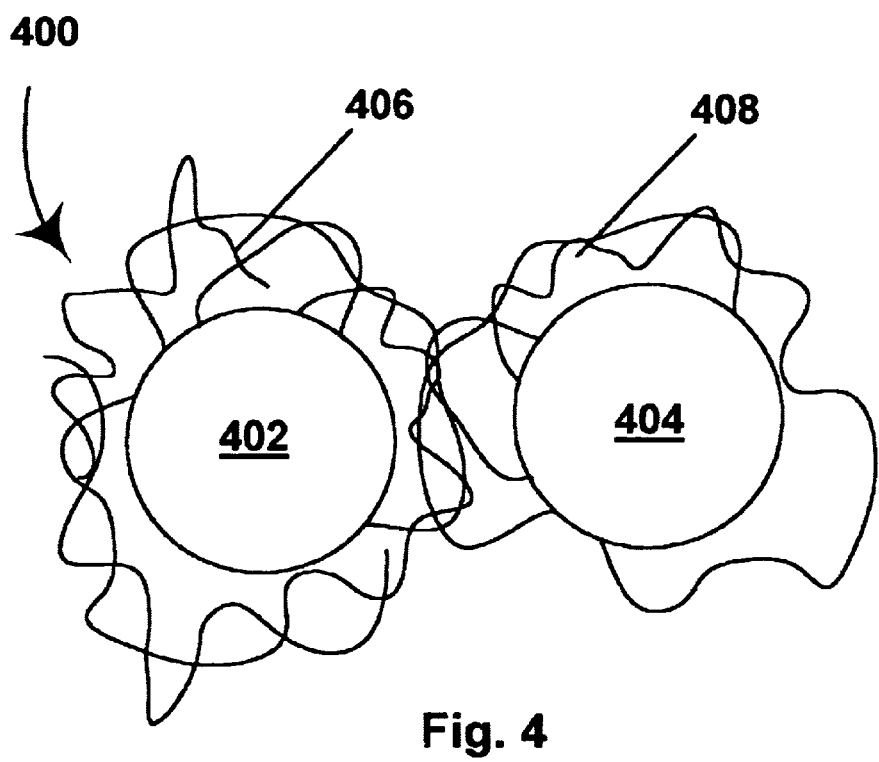
FIG. 4 is a schematic view of a single nanoparticle of a third electrophoretic display of the invention, this nanoparticle being formed from two coated nanoparticles having charges of opposite polarity.

FIG. 4 shows a single nanoparticle (generally designated 400) of a third electrophoretic display of the present invention. This nanoparticle 400 is composed to two separate gold nanoparticles 402 and 404, each of which bears a polymer coating 406 or 408 respectively. The nanoparticle 402 is positively charged, while the nanoparticle 404 is negatively charged, so that when no field is applied to the nanoparticles 402 and 404, they are held together by electrostatic attraction to form the combined nanoparticle 400. However, when a strong field is applied to the nanoparticle 400, the nanoparticles 402 and 404 will separate under the influence of this field. For reasons discussed above, the color of gold nanoparticles varies with the size of the particle, and hence the separation of nanoparticles 402 and 404 will change the color of the display.

FIGS. 5A and 5B show two different states (no electric field in FIG. 5A, and a strong direct current field in FIG. 5B) of a single nanoparticle unit (generally designated 500) which is generally similar to that shown in FIG. 4 in that it comprises two gold nanoparticles 502 and 504 each of which bears a polymer-coating 506 or 508 respectively, the nanoparticle 502 being positively charged, while the nanoparticle 504 is negatively charged. However, in contrast to the display shown in FIG. 4, the nanoparticles 502 and 504 are attached to opposed ends of a polymeric filament 510 having a length equal to several times the diameter of each of the nanoparticles 502 and 504. Accordingly, when no field is applied to the unit, as shown in FIG. 5A, the nanoparticles 502 and 504 are held together by electrostatic attraction to form the combined nanoparticle 500. However, when a strong field is applied to the nanoparticle 500, as shown in FIG. 5B, the nanoparticles 502 and 504 will separate under the influence of this field to the extent allowed by the polymeric filament 510. This filament is made long enough that the nanoparticles are separated by a distance sufficient to isolate them from one another so that the color of the display, in the state shown in FIG. 5B is that associated with the isolated nanoparticles 502 and 504. However, when the field is removed, the nanoparticles 502 and 504 will rapidly reassociate to form the combined nanoparticle 500.

It will be seen that the displays shown in FIGS. 4, 5A and 5B, especially that shown in FIGS. 5A and 5B, are capable of very rapid switching, since the color change only requires that the individual nanoparticles move relative to each other by a few nanoparticle diameters (a distance typically about 50–100 nm), in contrast to conventional displays which require the electrophoretic particles to move a distance approximately equal to the thickness of the medium, which is typically about 250 $\mu$m, or 250,000 nm. Thus, the displays just described should reduce switching times by at least two orders of magnitude as compared with conventional electrophoretic displays, thereby rendering the displays of the present invention suitable for use in video applications.

FIGS. 6A and 6B show two different states (no electric field in FIG. 6A, and a strong direct current field in FIG. 6B) of a single unit (generally designated 600) of a fifth electrophoretic display of the present invention. The unit 600 comprises two particles 602 and 604 attached to opposed ends of a filament 606. The particles 602 and 604 need not be nanoparticles and need not be color-forming; indeed, to allow maximum flexibility in the design of this type of display, it is generally preferred that the particles 602 and 604 be neither colored nor color-forming. The particles 602 and 604 bear charges of opposite polarity, particle 602 being positively charged and particle 604 negatively charged. The filament 606 is chosen to be of a type (for example, one or more polypeptide chains) which, in the absence of external forces, naturally assumes a helical or similar configuration; those skilled in the art will appreciate that the conformation of many polymers is strongly dependent upon the type of liquid in which they are immersed, and accordingly that in forming the type of display presently being described, both the filament 606 and the suspension liquid must be carefully chosen to produce the desired conformation of filament 606. A plurality of nanoparticles 608 are attached at intervals along the filament 606. In the state shown in FIG. 6A, in which no external electric field is applied, the electrostatic attraction between the particles 602 and 604, together with the natural helical conformation of the filament 606, results in the unit 600 assuming a compact configuration in which the various nanoparticles 608 contact or lie closely adjacent one another, so that the color of the unit is that of the aggregated nanoparticles 608. However, when a strong direct current electric field is applied to the unit, as shown in FIG. 6B, the particles 602 and 604 are drawn apart by the electric field and the filament 606 assumes an extended, substantial linear configuration, in which the nanoparticles 608 are separated from each other, so that the color displayed by the unit 600 is that of the dispersed nanoparticles 608. For reasons similar to those discussed above with reference to FIGS. 4, 5A and 5B, the display shown in FIGS. 6A and 6B is capable of very rapid switching. It should also be noted that, by varying the strength of the electric field, the unit 600 could be made to assume conformations intermediate those shown in FIGS. 6A and 6B, thus rendering the display capable of achieving multi-level gray scale.

Figure 7:
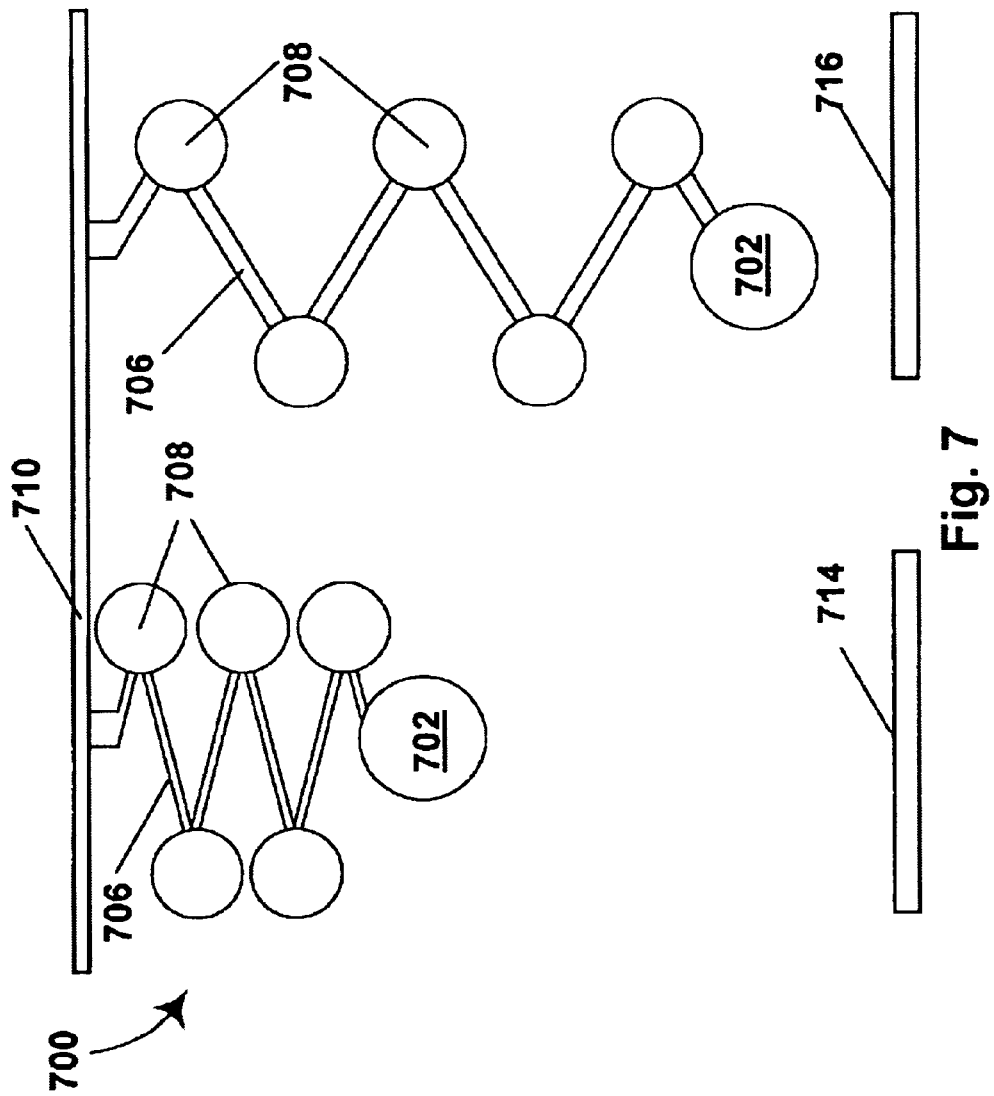
FIG. 7 is a schematic side elevation showing two different states of a sixth electrophoretic display of the invention, the units of this display being generally similar to that shown in FIGS. 6A and 6B except that one end of the filament is attached to a fixed body.

FIG. 7 illustrates a modification of the type of display shown in FIGS. 6A and 6B. Each of the units 700 shown in FIG. 7 is generally similar to that shown in FIGS. 6A and 6B, except that, instead of charged particles being provided at both ends of a filament, a (positively) charged particle 702 is provided at only one end of a filament 706, the other end of the filament 706 being bonded directly to a fixed body, in this case an electrode 710. Nanoparticles 708 are attached at intervals along the filament 706 in the manner already described.

FIG. 7 illustrates schematically the units 700 being used with a V/2 addressing scheme in which the common front electrode 710, to which the units 700 are attached, is held at +V/2, while two discrete rear electrodes 714 and 716 respectively are held at +V and 0 respectively. The left hand side of FIG. 7 shows electrode 714 held at +V, a higher potential than the front electrode 710. Accordingly, the positively charged particle 702 of unit 700 is repelled from electrode 714, and the unit 700 assumes a compact conformation similar to that shown in FIG. 6A, so that the color displayed is that of the aggregated nanoparticles 708. The right hand side of FIG. 7 shows electrode 716 held at 0, so that particle 702 is attracted to this electrode, and the unit 700 assumes an extended conformation similar to that shown in FIG. 6B and the color displayed is that of the dispersed nanoparticles 708. As with the unit 600 shown in FIGS. 6A and 6B, intermediate conformations, and hence gray scale, can be achieved. Also, the unit 700 is capable of rapid switching.

FIG. 8 shows a display of the present invention in which a large number of charged nanoparticles 802 (for purposes of illustration, the charge is assumed to be positive, and the number of nanoparticles is greatly reduced in FIG. 8 for ease of illustration) are tethered by filaments 804 of varying length to a fixed body, namely an electrode 806. In the same manner as in FIG. 7, the left hand side of FIG. 7 shows an electrode 808 held at +V, a higher potential than the electrode 806 to which the nanoparticles 802 are tethered. Accordingly, the positively charged nanoparticles 802 are repelled from electrode 808 and lie closely adjacent electrode 806. Thus, the nanoparticles 802 assume a close-packed configuration, so that the color displayed is that of the aggregated nanoparticles 802. The right hand side of FIG. 8 shows an electrode 810 held at 0, so that nanoparticles 802 is attracted to this electrode, and are spaced from the electrode 806 to the extent permitted by the lengths of their individual filaments 804. Thus, the nanoparticles 802 are separated from one another, and the color displayed is that of the dispersed nanoparticles 802. As with the displays previously discussed with reference to FIGS. 6A, 6B and 7, the display shown in FIG. 8 can achieve gray scale and is capable of rapid switching.

It should be noted that, in the types of displays illustrated in FIGS. 7 and 8, it might in some cases be possible to dispense to dispense with the presence of a fluid which normally surrounds the nanoparticles.

Figure 9A:
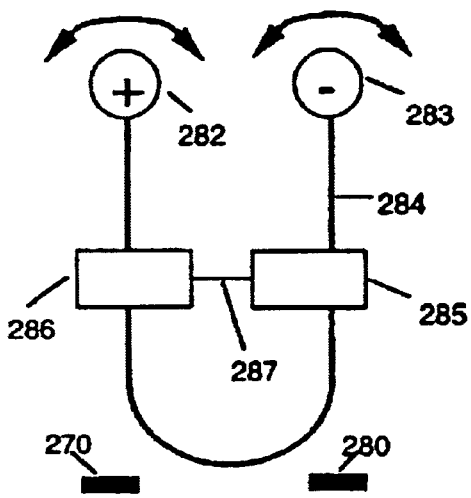
FIGS. 9A–9H illustrate various types of units generally useful in the electrophoretic displays of the invention, these units being generally similar to that shown in FIGS. 5A and 5B.
Figure 9B:
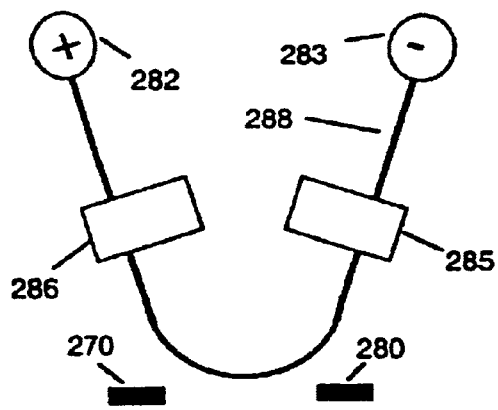
Figure 9C:
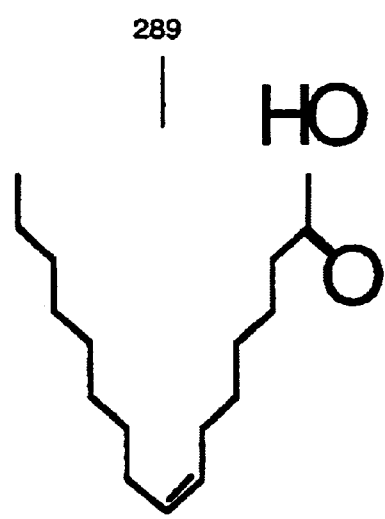

FIGS. 9A–9H illustrate embodiments of the invention which may be regarded as variations on the general type of system shown in FIGS. 5A and 5B in that they comprise two particles bearing opposing charges and being linked by a member which may be described as a filament. The embodiments are intended to be switched by in-plane electrodes 270 and 280, and some of them are intended to provide a first color change by means of applying an AC field and a second color change by means of application of either a DC field or an AC field of another frequency. Referring to FIGS. 9A–9B a hairpin shaped molecule or spring in the closed state 284 may have attached to it a positively charged 282 and a negatively charged 283 head; instead of net electric charge, these heads may have strong dipole moments. Additionally one side of the hairpin shaped molecule or spring has attached to it a leuco dye 286 and the other side of the hairpin shaped molecule or spring has attached to it a reducing agent 285. When the molecule or spring has attached to it a reducing dye 286 and the reducing agent 285 are brought into proximity, such that a bond is formed 287 and the leuco dye is effectively reduced, thus effecting a first color state. Upon applying an AC electric field with a frequency that is resonant with the vibrational mode of the charged heads cantilevered on the hairpin shaped molecule or spring, the bond 287 may be made to break thus yielding an open state 288. In this open state, the leuco dye and reducing agent are no longer proximal and the leuco dye, being in a non-reduced state, effects a second color state. The system may be reversed by applying a DC electric field which serves to reproximate the leuco dye and reducing agent groups. Many molecules or microfabricated structures may serve as the normally open hairpin shaped molecule or spring. These may include oleic acid like molecules 289. Reducing agents may include sodium dithionite. The system as discussed is bistable.

Figure 9D:
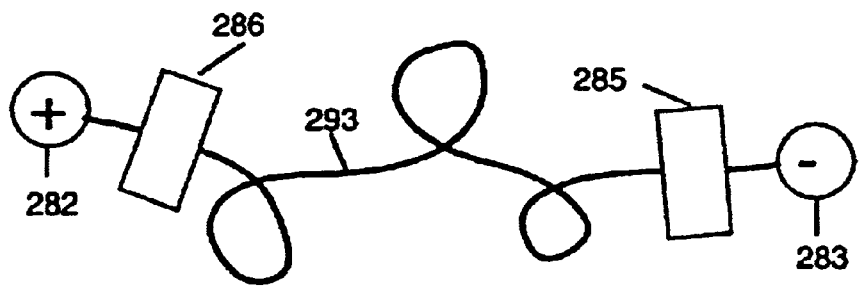
Figure 9E:
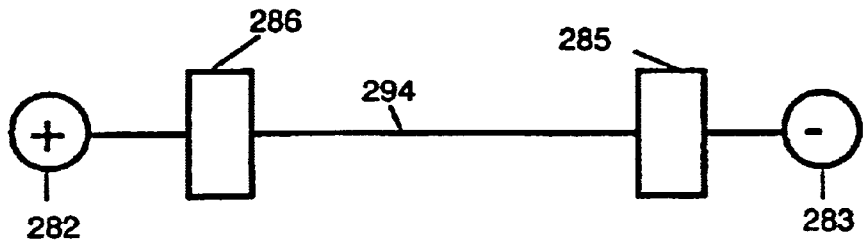
Figure 9F:
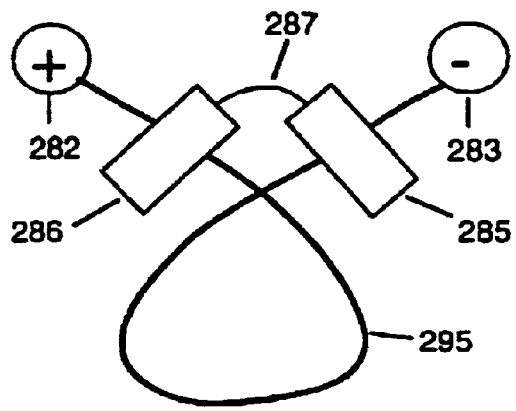

Referring to FIGS. 9D–9F an alternative leuco dye-reducing agent system may employ a polymer shown in FIG. 9D in a natural state 293. When a DC electric field is applied said polymer assumes a linear shape 294 with leuco 286 and reducing agent 285 groups spaced from each other. Upon removal of the DC field or application of an AC electric field, the polymer will tend to coil, bringing into random contact the leuco and reducing groups and forming a bond 287, with a corresponding color change.

Figure 9G:
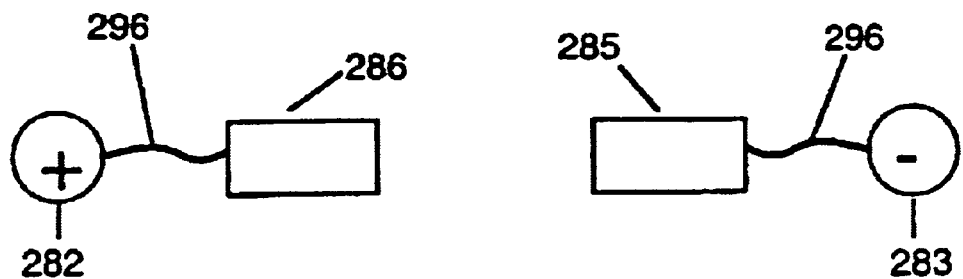
Figure 9H:
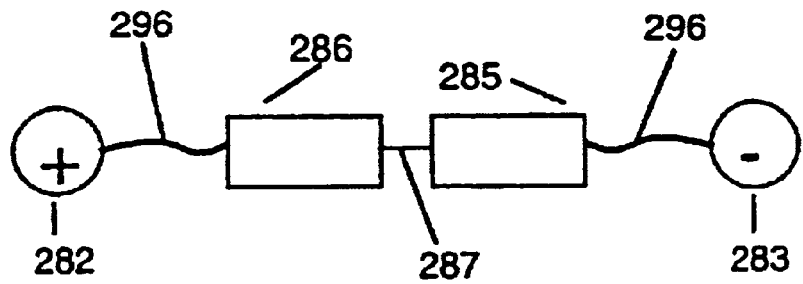

Referring to FIGS. 9G and 9H a similar system is possible but instead of a polymer leuco and reducing groups may be attached to oppositely charged microspheres directly by means of a bridge 296 which may be a biotin-streptavidin bridge, polymer bridge or any other suitable bridge. As before application of a DC field cause leuco and reducing groups to become distal whereas removal of the DC field or application of an AC field brings into random contact the leuco and reducing groups. A polymer may be added to aid in the stability of the oxidized state.

Figure 12:
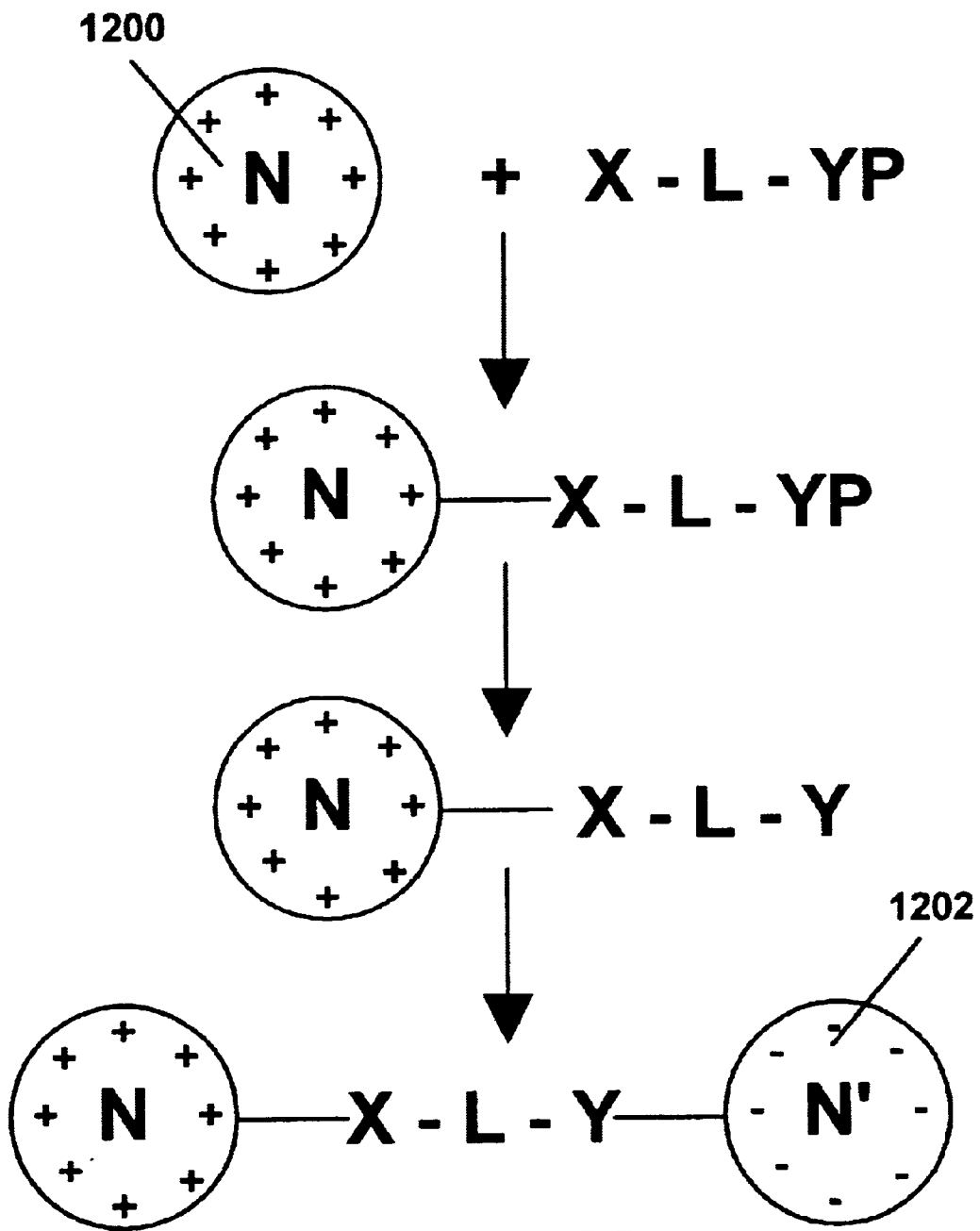
FIG. 12 illustrates the stages of a preferred process of the invention for producing a nanoparticle assembly.

FIG. 12 depicts schematically the various stages of the process of the present invention for forming nanoparticle assemblies. This process is primarily intended for use in forming two-nanoparticle assemblies, such as the nanoparticle unit 500 illustrated in FIG. 5, and FIG. 12 illustrates this type of process. However the process may also be used to form assemblies such as that shown in FIG. 8, in which a plurality of nanoparticles are linked to an electrode or other macroscopic object via separate linking groups.

In the first stage of the process, a first nanoparticle 1200, shown as positively charged, is treated with a linking reagent X where X is a first functional group capable of reacting with the nanoparticle under the conditions used, L is the desired linking group, Y is a second functional group, which is protected by a protecting group P so that the protected group YP is not capable of reacting with the nanoparticle under the conditions used. (It will be appreciated that if desired, for example for ease of storage, the linking reagent could be stored in a form P'X-L-YP, where Pi is a protecting group for the group X, and the protecting group P' could be removed prior to the reaction with the nanoparticle 1200, or even in situ during the reaction.) The groups X and Y may be the same or different. The group X reacts with the nanoparticle to form an intermediate species which may be symbolized as [N]-X-L-YP where [N] is the nanoparticle. Thus, the nanoparticle now carries the linking group L (and the protected form YP of the second functional group Y). In most processes of the invention, as for example when it desired to form assemblies such as those shown in FIGS. 5 and 8, it is desirable that only a single linking group be attached to each nanoparticle, and skilled chemists will be aware of various techniques (for example, keeping the concentration of linking reagent in the reaction mixture low) which may be used to minimize the number of nanoparticles which become attached to more than one linking group.

In the second stage of the process, the intermediate species [N]-X-L-YP is treated with a modifying reagent which generates the free form of the second functional group Y by removing the protecting group P therefrom. (In the present invention, it is not essential that the second functional group be generated by removal of a protecting group from a protected form of the second functional group, although this is the presently preferred way of generating the second functional group. For example, the second functional group may be generated by replacing a completely different group originally present on the linking reagent with the desired second functional group; for instance, a chloro group might be replaced by a thiol group.) The second functional group Z is capable of reacting with the object to which the nanoparticle 1200 is to be linked, in this case a negatively charged nanoparticle 1202. The generation of the second functional group produces a second intermediate species [N]-X-L-Y as shown in FIG. 12.

Finally, in a third stage of the process, the second intermediate species is contacted with the object to which the nanoparticle 1200 is to be linked, in this case the negatively charged nanoparticle 1202, under conditions such that the second functional group Z reacts with the nanoparticle 1202, leaving the two nanoparticles 1200 and 1202 linked via the linking group L and producing the desired nanoparticle assembly.

It will readily be apparent that the process shown in FIG. 12 could be modified to produce the type of assembly shown in FIG. 8 by contacting the second intermediate species with an electrode or similar macroscopic object instead of with a second nanoparticle.

Typically, in the process shown in FIG. 12, the two nanoparticles will be formed of the same material, which will usually be an electrically conductive metal, for example silver, gold, platinum, palladium or an alloy of any of these metals. Preferably, the two nanoparticles have diameters not greater than about 60 nm. Functional groups capable of reacting with the aforementioned metals are described in the literature, and any of the functional groups known to react with the metal used may be employed. Preferred first functional groups are thiol, amine, phosphine and hydroxyl groups (in the last case, the effective functional group is the O⁻ group formed by deprotonation of the hydroxyl group). The linking group L may be, for example, an alkyl or alkylene group, and desirably has a length not greater than about 50 nm. As in the case of the first functional group, the second functional group may be any of the functional groups known to react with the object used; in the case of the aforementioned metals, the third functional group is desirably a thiol, amine, phosphine or hydroxyl group. As already mentioned, the second functional group is preferably originally present in a protected form. Thus, for example, when the second functional group is a thiol group, the protected form of this group may be a thiol group protected by a benzyl, acetyl, alkyl, carbonate or carbamate protecting group. Similarly, when the second functional group is an amine group, the protected form may be an amine group protected by a benzyl, carbonate, carbamate or alkyl group, or in the form of an mine, amide or urea grouping.

If the two nanoparticles used to form an assembly of the type illustrated in FIG. 12 are chosen to have different surface characteristics, the nanoparticles need not be charged prior to synthesis of the assembly but could be charged in the final assembly.

Although the present process has been described above as a three-stage process, it will be apparent to skilled chemists that in some cases the generation of the second functional group may be carried out in the presence of the object with which the second functional group is to react, so that the second functional group is generated in situ, and immediately reacts with the object, thus telescoping the three-stage process into a two-stage process.

As already mentioned, the nanoparticles used in the processes described above may bear coatings of polymers or other materials. When such coated nanoparticles are used in the present processes, the first and third functional groups may react either with the nanoparticle itself or with the coating material, although the former is normally preferred since it affords more reliable control of the spacing between the nanoparticles. In practice, most techniques used for attaching a coating material to a nanoparticle leave a substantial proportion of the surface of the nanoparticle exposed, so that the linking reagent can still react with the surface of the nanoparticle itself despite the presence of the coating material. When the nanoparticle is of a core/shell type, in which a core of one material is completely surrounded by a shell of a different material, the linking reagent should of course be chosen to react with the shell material.

In the nanoparticle assemblies of the present invention, a plurality of nanoparticles may be attached to a filament or backbone, and the spacing between the individual nanoparticles can be varied by changing either the position of the nanoparticles relative to the backbone or the conformation of the backbone itself by redox reactions, or changes in pH, ionic strength, temperature or other physicochemical parameters. While the type of nanoparticle assemblies shown in FIGS. 6A, 6B, 7A and 7B discussed above rely upon the presence of charged particles at the ends of the backbone, such charged particles are not essential, as shown by the nanoparticles assemblies in FIGS. 13 and 14.

Figure 13A:
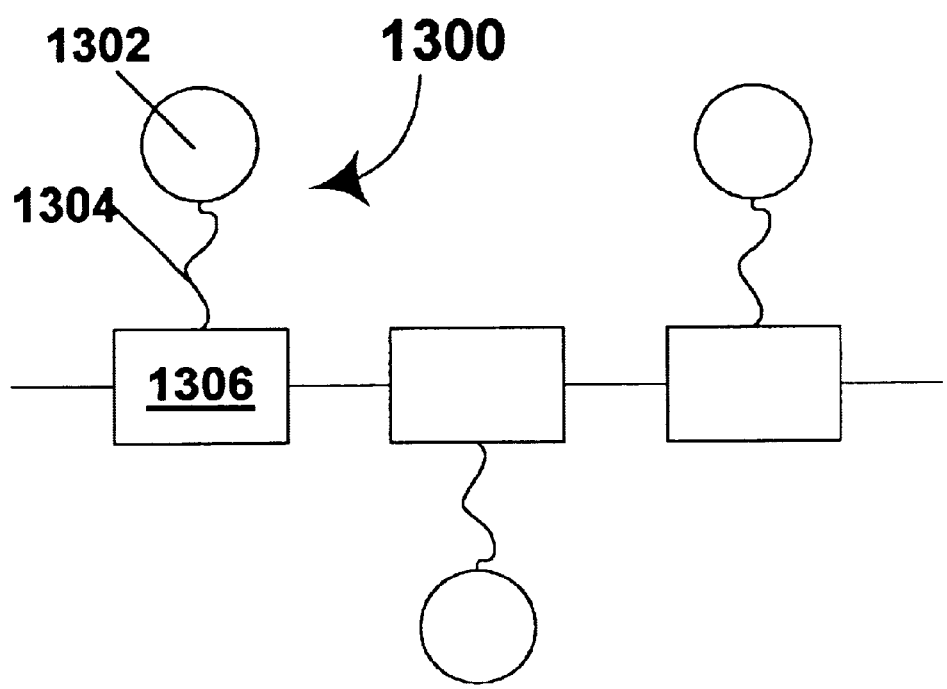
FIGS. 13A and 13B show two different states of a nanoparticle assembly of the invention in which a plurality of nanoparticles are linked to a polymer chain via flexible filaments.
Figure 13B:
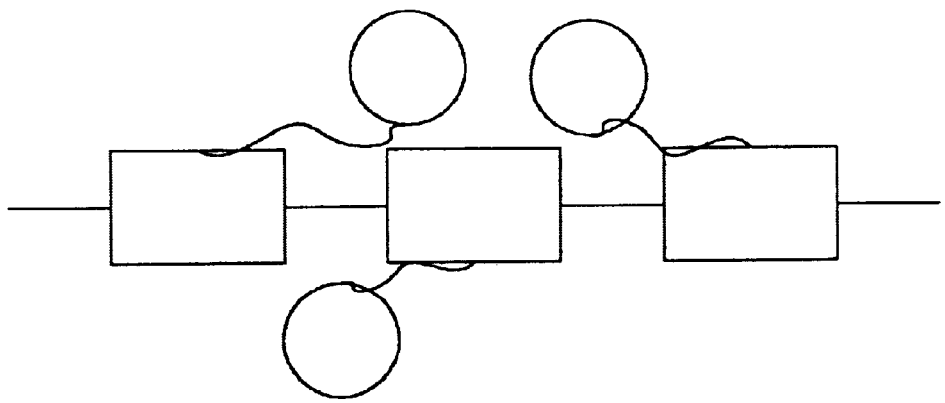

For example, FIG. 13A of the accompanying drawings illustrates, in a highly schematic manner, a nanoparticle unit (generally designated 1300) in which a plurality of charged nanoparticles 1302 (assumed to be negatively charged for purposes of illustration, though obviously positively charged nanoparticles could also be used) are connected via short flexible tethers or side chains 1304 to repeating units 1306 of a polymer. The polymer, which is normally an electroactive conjugated polymer, is chosen so that the charge on the repeating units 1306 can be varied (for example, by a redox reaction, or a change in pH). When the repeating units 1306 are electrically neutral or negatively charged, the nanoparticles will tend to adopt the positions shown in FIG. 13A, in which the tethers 1304 extend essentially perpendicular to the polymer chain, so that the average distance between adjacent nanoparticles 1302 is relatively large. On the other hand, when the repeating units 1306 are positively charged, so that they attract the negatively charged nanoparticles 1302, the nanoparticles will adopt the positions shown in FIG. 13B, in which the nanoparticles lie adjacent the polymer chain, so that the average distance between adjacent nanoparticles 1302 is substantially smaller than in FIG. 13A, and accordingly the color of the polymer changes.

Figure 14A:
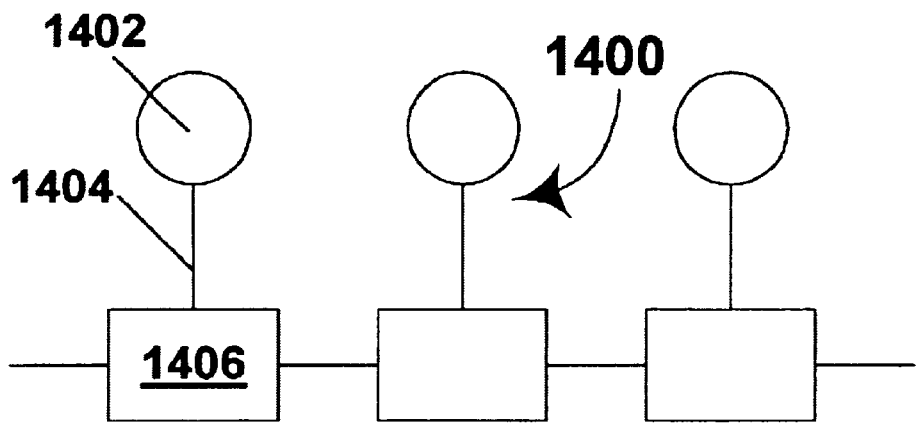
FIGS. 14A and 14B show two different conformations of a nanoparticle assembly of the invention in which a plurality of nanoparticles are linked to a polymer chain having two different conformations.
Figure 14B:
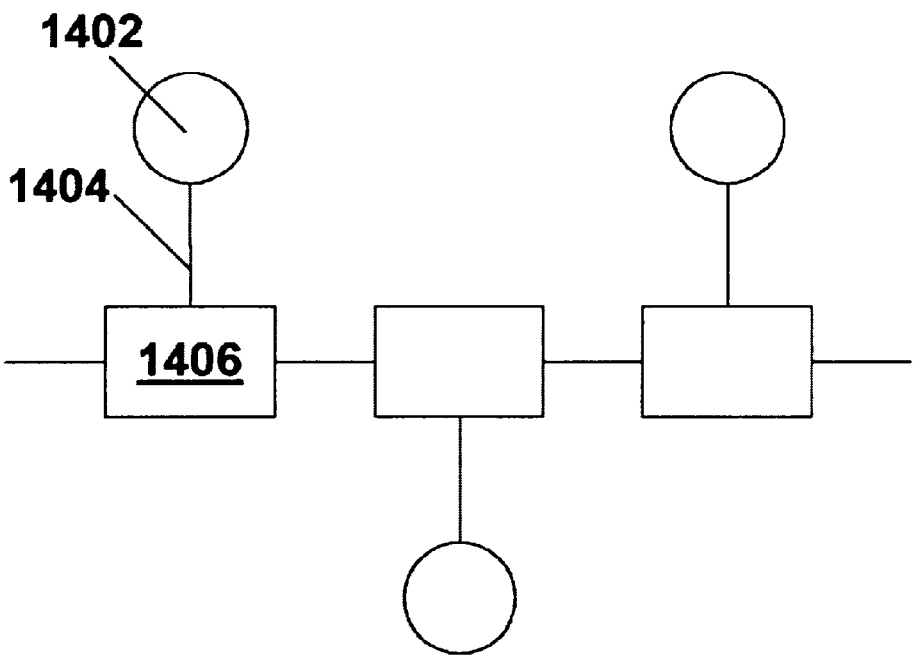

FIGS. 14A and 14B illustrate, in a highly schematic manner, another type of nanoparticle unit in which the spacing between the nanoparticles is varied by changes in the conformation in a polymer backbone. It is known that certain polymers (for example polystilbenes, polythiophenes, polyanilines, polypyrroles, and polymers that contain common redox-dependent shape changing moieties such as thianthrenes, calixarenes, aza groups, cyclooctatetraenes and bipyridines), undergo changes in conformation (i.e., changes in the relative positions of adjacent repeating units in the polymer chain) when subjected to redox reactions or changes in temperature. See, for example:

D. T. McQuade et al., "Conjugated Polymer-Based Chemical Sensors", Chem. Rev., 700, 2537–2574 (2000);

M. E. G. Lyons (ed.), "Electroactive Polymer Electrochemistry, Part I Fundamentals", Plenum Press, New York (1994); and T. A. Skotheim et al. (eds.), "Handbook of Conducting Polymers", 2d. Edn., Marcel Dekker, New York (1998).

FIG. 14A shows a nanoparticle unit (generally designated 1400) of this type in which a plurality of nanoparticles 1402 are connected via tethers or side chains 1404 (which in this instance are preferably rigid) to repeating units 1406 of a polymer capable of undergoing such a change in conformation. In the conformation shown in FIG. 14A, the repeating units 1406 hold the tethers 1404 parallel to one another, so that the distance between adjacent nanoparticles 1402 is relatively small. However, subjecting the polymer backbone to a redox reaction causes the polymer to adopt the conformation shown in FIG. 14B, in which the repeating units 1406 cause alternate tethers 1404 to point in opposite directions, so that the distance between adjacent nanoparticles 1402 is substantially increased, thus resulting in a color change. FIGS. 14A and 14B are simplified for ease of illustration; in practice, the change in angle between adjacent tethers will usually not be 180°, but might be for example 120°, so that in the conformation shown in FIG. 14B the nanoparticles would occupy positions on a helix having its axis along the polymer backbone, but such a helical conformation would also bring about the desired increase in distance between adjacent nanoparticles.

The type of nanoparticle unit illustrated in FIGS. 14A and 14B has the advantage that a one-electron redox reaction can, in some cases, cause a change in conformation of an entire polymer chain comprising numerous repeating units, so that the number of electrons required to bring about color change of a large number of nanoparticles is small. Thus, if, as will typically be the case, the redox reaction is carried out electrochemically, the power required per unit area to bring about the color change is small.

In nanoparticle units of the types illustrated in FIGS. 13A, 13B, 14A and 14B, the polymer may be in the form of a film (provided that the properties of this film permit the necessary movement of the nanoparticles), or may be in solution or suspension in a liquid medium.

Another type of nanoparticle-based display uses a so-called "lamellar" polymer. It is known that films of certain polymers can be treated so that the polymer chains lies predominantly parallel to one another. If a polymer similar to those illustrated in FIGS. 13A, 13B, 14A and 14B, in which nanoparticles are attached at regular intervals along a polymer chain, is formed into a lamellar film in this manner, application of an alternating current field (typically in the radio frequency range) will change the average distance between the nanoparticles, thus bringing about a color change.

Yet another type of nanoparticle-based display comprises a number of nanoparticles dispersed within a gel. As previously discussed, such a gel could be formed by linking the filaments of a plurality of nanoparticle assemblies, in which cases application of an electric field to the gel will cause movement of the nanoparticles and changes in the optical characteristics of the gel. Alternatively, the gel itself may be swellable, preferably electroswellable, or otherwise change its conformation when an electric field is applied. In this case, as the gel swells, the distance between adjacent nanoparticles increases, thus bringing about a color change. Swellable gels are known which could increase the spacing between adjacent nanoparticles by a factor in excess of two. In most types of display, it will be, at the least, inconvenient to have a substantial change in the volume of the display medium itself as the color of the display medium changes, especially since in most applications it will be desired to have different parts of the display medium in differing color states at the same time. Accordingly, in the swellable gel type of nanoparticle display, it is generally preferred that the gel be in the form of particles dispersed in a liquid medium, so that, as the gel swells and imbibes the liquid medium into itself, the overall volume change of the gel/liquid system is minimal. Preferably, in such a gel/liquid system, swelling of the gel is effected by carrying out a redox reaction, desirably an electrochemical redox reaction, to change the ionic strength of the liquid medium.

The aforementioned types of polymeric media and gels may also make use of changes in the electrical conductivity of the polymeric medium or gel rather than changes in the physical spacing between the nanoparticles. In such polymeric media and gels, the nanoparticles may or may not be chemically bonded to the polymer or gel. For example, a collection of nanoparticles could be embedded in a polymer that becomes conductive on oxidation, e.g., polythiophene or poly(p-phenylenediamine).

In designing such polymeric media and gels, there are two main considerations (which are, of course, applicable to all variable conductivity nanoparticle assemblies of the present invention). Firstly, the change in optical characteristics upon change in electrical conductivity varies with the number of nanoparticles which are thereby placed in electrical contact with each other; the greater the number of nanoparticles placed in electrical contact, the greater the change in the absorption spectrum. Accordingly, other things being equal, nanoparticle assemblies which place a large number of nanoparticles in electrical contact with each other tend to be more suitable for most display applications than assemblies which only place a small number of nanoparticles in electrical contact. Secondly, there is the question of "electron efficiency" in the sense of how many electrons (i.e., how much electrical current) is necessary to bring about a desired change in optical state of a given quantity of medium (or a practice, a given area of a display). It is desirable that a display have a high electron efficiency in order to keep the current density and power consumption of the display as low as possible.

Both considerations suggest that a preferred embodiment of the present invention is one in which a large number of nanoparticles are associated with a single polymer chain in such a manner that addition or withdrawal of a single electron (or, less desirably a small number of electrons) from or to the polymer chain will cause a change in conductivity of the whole chain. Such a polymer should undergo a substantial change in optical characteristic while requiring a minimal number of electrons per unit area of a display, and thus have a low power consumption.

Various methods for the synthesis of such preferred polymers will be apparent to those skilled in polymer synthesis. In one preferred method, a polymer is synthesized based on one of the known conductive backbones (for example, polyaniline, polythiophene, polyphenylene, or polypyrrole), but with a ligand side chain, most preferably comprising a sulfur, selenium, tellurium, or low-valent phosphorus moiety, on some or all of the repeating units in the polymer chain. These ligand side chains can be used to bind nanoparticulates having either conductive (for example, silver or gold) or semiconductive (for example, cadmium sulfide, selenide or telluride) properties. Because the polymer will be expected to bind very strongly to such particles through multiple sites on the polymer, the electronic coupling induced by an electrochemical oxidation or reduction reaction in this case may be strong overall even if the coupling though each individual ligand site is small.

A second preferred method of synthesizing such polymers involves the condensation of an array of nanoparticles with a relatively simple monomeric or oligomeric ligand having at least two coordinating groups (for example, the dithiotrithiophene prepared in Example 1 below). Such a ligand, if combined with a nanoparticle having exchangeable surface groups, or if combined with other diluting monovalent surface ligands during synthesis of the nanoparticle, will lead to the formation of polymeric chains of nanoparticles connected by the multivalent ligand. The degree of crosslinking and aggregation in the resultant polymer can be controlled by adjusting the relative and overall concentration of the multivalent and monovalent ligands in this synthesis; if the multivalent ligand is used in excess, the polymer formed may be highly crosslinked and intractably insoluble or too highly aggregated.

These two methods of synthesis can be combined to yield hybrid structures with structural features of both approaches. In addition, a single polymer might contain multiple types of conductive and/or semiconductive nanoparticles. Electronic coupling between such heterogeneous sets of particles may give rise to interesting optical effects.

This approach has the advantage that a large number of particles can be in contact with a single polymer chain, so that the optical state of a substantial amount of the medium can be changed using relatively few electrons.

A further type of nanoparticle-based display uses individual nanoparticles dispersed in a liquid medium. However, instead of aggregating all the nanoparticles as in some of the displays described above, this type of display relies upon changes in the boundary layer around each nanoparticle to control the spacing between adjacent nanoparticles and thus bring about a color change. For example, by subjecting the liquid medium to a redox reaction, the properties of this medium (such as dielectric constant) can be changed so as to vary the thickness of the boundary layer around each particle. In a variation of this approach, layers of two gels, differing in properties such that certain nanoparticles display different colors in each gel, could be placed adjacent one another, and charged nanoparticles moved electrophoretically between the two gels.

Figure 15:
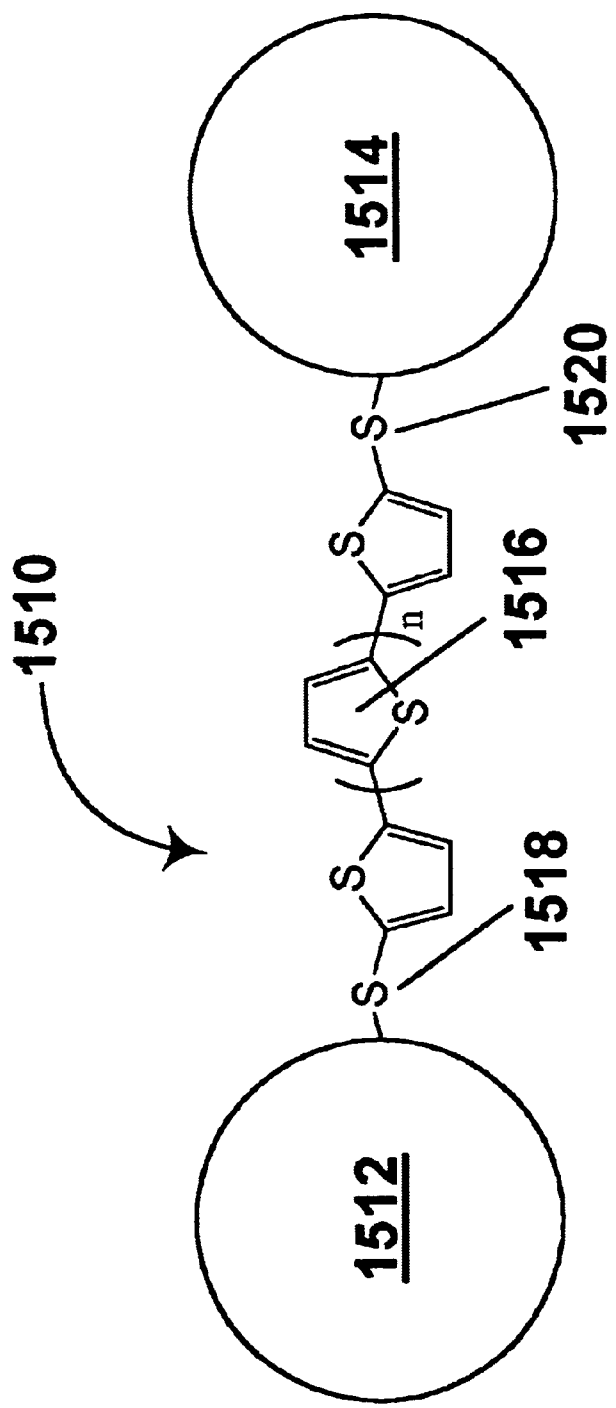
FIG. 15 is a schematic view of a nanoparticle assembly of the invention the optical properties of which are varied by changing the conductive state of a tether connecting two nanoparticles.

FIG. 15 shows a preferred variable conductivity nanoparticle assembly of the invention, generally designated 1510. This assembly 1510 comprises two gold nanoparticles 1512 and 1514 (other metals may alternatively be used) linked by a polythiophene oligomer 1516, in which n is an integer from 0 to 10. The oligomer 1516 is linked to the nanoparticles 1512 and 1514 by sulfide linkages indicated at 1518 and 1520.

Figure 16A:
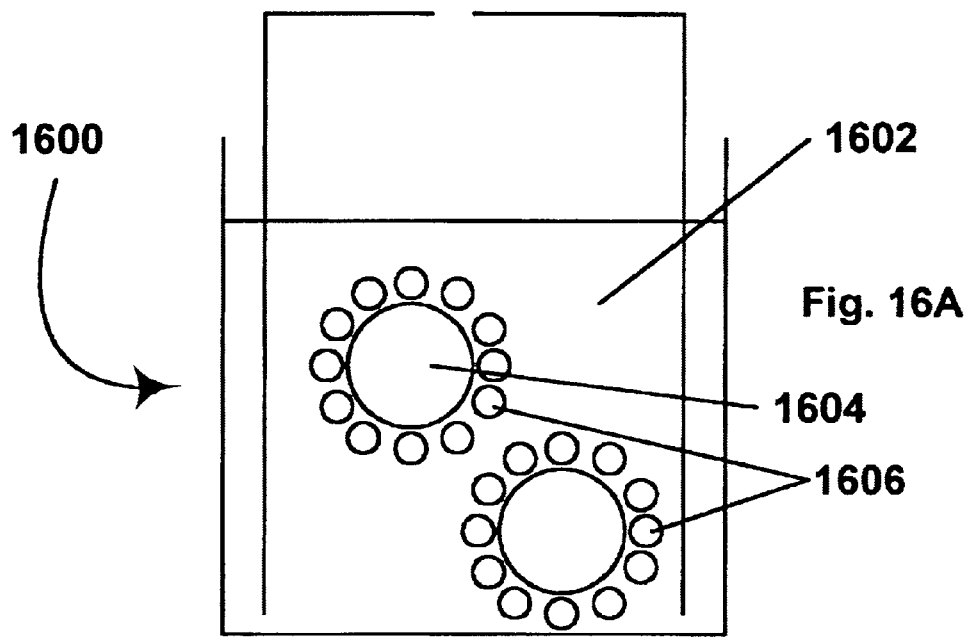
Figure 16B:
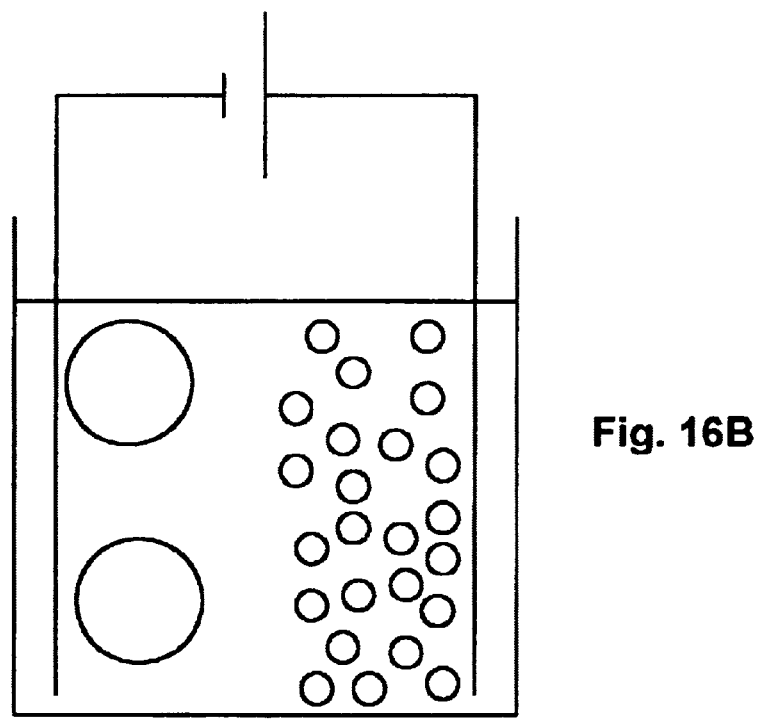

FIGS. 16A and 16B are schematic views of a tether-less two particle electro-optic medium (generally designated 1600) of the present invention, FIG. 16A showing the state of the medium in the absence of an electric field and FIG. 16B the state of the medium in the presence of an electric field. The medium 1600 comprises a suspending fluid 1602 in which are dispersed a plurality of a first type of particle 1604 and a plurality of a second type of particle 1606. The first type of particles 1604 are light-transmissive and preferably transparent; these particles may, for example, be formed from silica, titania or a polymer, examples of suitable polymers being polystyrene, a polyester or a polyacrylate. The first type of particles 1604 are also substantially larger than the second type of particles 1606; the former will typically have an average diameter in the range of about 500 to about 2000 nm, while the latter are nanoparticles typically having an average diameter in the range of from about 3 to about 60 nm. (Those skilled in the relevant art will appreciate that this type of electro-optic medium can tolerate considerable variations in the diameters of individual particles of the two types, provided that the first type of particles are substantially larger than the second type of particles.) The second type of particles 1606 are formed of a material such that the optical characteristic of particles when aggregated on the surfaces of the particles 1604 (as shown in FIG. 16A) is different from that of the particles 1606 dispersed singly in the suspending fluid 1602, as shown in FIG. 16B. As previously discussed, nanoparticles 1606 formed from a electrically-conductive material, particularly a metal such as gold or silver, are suitable, and nanoparticles made of a semiconductive material such as cadmium selenide may also be suitable.

The two types of particles 1604 and 1606 bear charges of opposite polarity; for purposes of illustration, it is assumed herein that the large particles 1604 are positively charged and the nanoparticles 1606 negatively charged, but these charges could of course be reversed.

As already mentioned, FIG. 16A illustrates the display 1600 in the absence of an electric field. In this condition, the nanoparticles 1606 are electrostatically attracted to the particles 1604 and thus aggregate together on the surfaces of the particles 1604. In this state, the display presents the optical characteristic of the aggregated nanoparticles 1606. FIG. 16B illustrates the display 1600 subjected to an electric field strong enough to remove the nanoparticles 1606 from the surfaces of the particles 1604. In this condition, the nanoparticles 1606 become dispersed throughout the suspending fluid and the display presents the optical characteristic of the non-aggregated nanoparticles 1606.

A wide variety of processes may be used to produce the non-composite nanoparticles used in the displays of the present invention, but such processes fall into two main groups, namely "surface processes", in which the nanoparticles are formed on or adjacent a-surface or boundary between two different phases, and "bulk processes", in which the nanoparticles are formed within a single phase. These two types of processes will now be described separately.

The surface processes themselves may be further subdivided into true surface processes, in which the nanoparticle material (i.e., the material which will form the nanoparticles) is deposited as a simple layer on a surface, and "surface layer processes", in which the nanoparticle material is deposited within a surface layer, the properties of which differ from those of the underlying bulk material. Finally, the true surface processes may be divided into selective deposition processes, in which the nanoparticle material is deposited on only certain selected parts of the surface, and non-selective deposition processes, in which the nanoparticle material is deposited over the whole surface and the resultant continuous layer of nanoparticle material is later ruptured to form the individual nanoparticles.

One type of selective deposition process which may be useful in the present invention is that described in Jensen et al., "Nanosphere Lithography: Tunable Localized Surface Plasmon Resonance Spectra of Silver Nanoparticles", J. Phys. Chem., B 104, 10549 (2000). In this process, a surface is covered with a close-packed layer of nanoscopic beads and then a metal is deposited on the bead-covered surface by thermal evaporation or physical vapor deposition (PVD); the metal deposits on the surface only within the essentially triangular areas left between the close-packed beads, so that the metal particles formed on the surface have essentially the form of frusta of triangular pyramids (metal also, of course, deposits on the surfaces of the beads). The height of these frusta can be varied by controlling the duration of the metal deposition process. The beads are removed from the surface by any convenient technique; the aforementioned paper uses sonication in dichloromethane or ethanol, leaving the metal frusta behind. Since the aforementioned paper is concerned solely with the properties of the metal particles on the surface, it does not discuss techniques for removal of particles, but one convenient technique for such removal would be to coat the surface, prior to the deposition of the beads, with a thin layer of a material which is not soluble in the solvent used to remove the beads, but which can readily be removed by application of a different solvent. For example, various types of polymer are known which are not readily soluble in organic solvents but which dissolve in aqueous alkali.

The metal deposition process could be replaced by other low cost deposition techniques, for example electro-deposition or electrophoresis, instead of PVD, which requires a costly high vacuum process.

A second type of selective deposition process uses a substrate which is covered with a thin layer of a deformable material, for example a polymer or a soft metal such as gold. The thin layer is micro-embossed to form regions of reduced thickness having the forms of the desired nanoparticles, and the embossed layer is etched to remove the regions of reduced thickness, thus leaving apertures extending to the substrate itself. The desired nanoparticle material is deposited into the apertures, for example by CVD, and the remaining portions of the thin layer are removed, typically by treating the substrate with an appropriate solvent, to leave the nanoparticle material as discrete prisms on the substrate. The resultant nanoparticles may be removed from the substrate, for example by sonication in the presence of a liquid. Alternatively, prior to the deposition of the layer of deformable material, the substrate could be coated with a sacrificial layer which would remain in place throughout the formation of the nanoparticles but which could be dissolved by an appropriate solvent to release these nanoparticles.

A variant of this type of process may be useful in forming composite nanoparticles. If the size of the apertures formed by micro-embossing and etching (other processes may alternatively be used) is carefully controlled, the embossed surface can be treated with a suspension of a first type of particle having a size such that only one particle will enter into each aperture, leaving a small space between the particle and the wall of the aperture. One particle enters each aperture, and thereafter the embossed surface is treated with a suspension of a second type of particle having a size such that only one particle can enter into the space left between the previously-deposited particle and the wall of the aperture. Thus, after treatment with the second suspension, each aperture contains one particle of the first type and one particle of the second type. The substrate is then heated (or possibly subjected to an appropriate chemical treatment) to cause the two particles within each aperture to coalesce to form a single composite nanoparticle, which can be released from the substrate by any of the techniques previously described.

One type of non-selective deposition process which may be used to form nanoparticles useful in the present invention employs a surface formed from a block copolymer. It is well known to those skilled in polymer technology that certain block copolymers are microphase-separated (i.e., they are composed of a mixture of minute regions of at least two different phases) and that these two different phases are present on the surface of the copolymer. It is also known that if the bonds in one of the microphases are disrupted by exposure to X-rays, ultra-violet radiation, ozone, electron beams or other similar techniques, in some cases one microphase can be dissolved in a solvent leaving the other phase behind. Accordingly, to produce nanoparticles, a thin layer of the nanoparticle material could be deposited upon such a microphase-separated block copolymer surface by any convenient technique, such as CVD, sputtering or electrophoresis. After disruption of the bonds in one microphase (which might be effected before or after deposition of the nanoparticle material), the copolymer surface could then be treated with a solvent which dissolves one microphase but not the other, thus rupturing the layer of nanoparticle material, removing the portions of this layer overlying the first microphase, and leaving the remaining portions of this layer (those overlying the second microphase) behind as discrete nanoparticles. Finally, the surface could be treated with a second solvent which dissolves the second microphase, thus liberating the nanoparticles. If the block copolymer and the second solvent are chosen carefully, the suspension of nanoparticles in the second solvent produced by this process may be ready for use in the nanoparticle display.

One advantage of using true surface processes to produce nanoparticles is that such processes leave one or more surfaces of the nanoparticles exposed at one stage of the process, while one other surface (that facing the substrate) is hidden at the same stage. Accordingly, it is possible to treat the exposed surface(s) of the nanoparticles (either by chemical treatment or by overlaying a thin layer of another material having any desired properties) while leaving the hidden face untreated. For example, if the nanoparticles are intended to be used in one of the types of unit described in the aforementioned U.S. Pat. No. 6,323,989 in which tethers are attached to the particles, it may be desirable to passivate the exposed surface(s) of, the nanoparticles by oxidation or by coating with an essential inert layer, thereby substantially reducing the reactive surface of the nanoparticles and reducing the chance that more than the desirable number of tethers will be attached to one nanoparticle. Surface treatment of the nanoparticles on the substrate may also be used to vary their absorption characteristics, and thus the colors they exhibit in the final display. For example, the aforementioned Jensen et al. paper states that providing a thin layer of a dielectric material on the exposed surfaces of the nanoparticles can change their absorption characteristics.

One type of surface layer process for the production of nanoparticles uses an anodized aluminum substrate (any similar surface-oxidized metal substrate with the appropriate properties, as described below, may be substituted). It is known that anodized aluminum can be produced having relatively uniformly-sized elongate pores; see, for example:

M. R. Black et al., Measuring the dielectric properties of nanostructures using optical reflection and transmission: bismuth nanowires in porous alumina, in T. M. Tritt et al. (eds.), Thermoelectric materials The next generation materials for small-scale refrigeration and power generation applications: MRS Symposium Proceedings, Boston, December 1999, Materials Research Society Press, Pittsburgh Pa. (2000); and D. Al-Mawlawi et al., "Nano-wires formed in anodic oxide nano-templates", J. Mater. Res., 9, 1014 (1994).

The desired nanoparticle material may be deposited within the pores, for example by CVD or other conventional process, and the aluminum surface layer dissolved, conveniently by concentrated alkali, to produce nanoparticles in the form of long rods.

Various types of bulk processes for the production of nanoparticles will now be described. Although such bulk processes are typically carried out in liquid media, the use of such liquid media is not essential; for example, nanoparticles can be formed by carrying out a chemical reaction which results in the precipitation of the desired, nanoparticle material inside a solid polymer swollen with a suitable solvent Alternatively, the nanocrystals could be synthesized inside the polymer through a vapor-phase infiltration of the starting materials. These approaches are described in:

J. F. Ciebien et al., "A Brief Review of Metal Nanoclusters in Block Copolymer Films"., New Journal of Chemistry, 22, 685 (1998); and B. H. Sohn et al., "Magnetic Properties of Iron Oxide Nanostructures within Microdomains of Block Copolymers", Journal of Magnetism and Magnetic Materials, 182, 216 (1998).

One important type of bulk process for the production of nanoparticles uses micelles formed by a surfactant in a liquid, typically an aqueous liquid. It is known that micelles having reproducible, non-spherical shapes, such as ellipsoids and rod-like forms, can be produced. Precipitation of nanoparticle material within a solution containing such non-spherical micelles results, under appropriate conditions, in the formation of non-spherical nanoparticles having substantially the same shape as the micelles. See, for example:

B. Messer et al., "Hydrophobic Inorganic Molecular Chains [$Mo_3Se_3$—] and their Mesoscopic Assemblies", Presentation C5.8 at the Materials Research Society Symposium, November–December 2000, Boston, Mass., and J. Brinker et al., "Rapid Prototyping of Patterned Functional Nanostructures", MRS Conference, Apr. 24–28, 2000, San Francisco, Calif.

Similarly, introduction of very small particles of nanoparticle material within a solution containing such non-spherical micelles can cause trapping and coalescence of particles within the micelles to produce non-spherical nanoparticles.

As already indicated, this invention also provides an improvement in the prior art process in which a metal-containing ionic species is transferred from an aqueous phase to an organic phase using a phase transfer reagent, the ionic species subsequently being reduced in the organic phase to produce metal nanoparticles. Such processes are described, for example in Brust et al. J. Chem. Soc., Chem. Commun, 1994, 801, and Korgel et al., J. Phys. Chem. B, 7998, 102, 8379. For gold nanoparticles, $AuCl_4^-$ is transferred from aqueous solution to toluene, while for silver nanoparticles, $Ag^+$ is transferred from aqueous solution to chloroform. In both cases, tetraoctylammonium bromide (TOAB) is used as the phase-transfer reagent, and the reduction is effected using aqueous sodium borohydride in the presence of an alkanethiol. It has now been discovered that in such processes the expensive TOAB can be replaced by a much less expensive tetrabutylammonium halide, preferably the bromide (TBAB), with a substantial reduction in the cost of the nanoparticles produced. It has been found that when using TBAB, it is advisable to increase the molar ratios of alkanethiol to metal and phase transfer agent to metal, as compared with the same ratios in the prior art processes already mentioned, but this invention still provides a substantial reduction in the cost of producing the nanoparticles. It should be noted that although hexanethiol is used as the alkanethiol in Example 2 below, any alkanethiol containing from 2 to about 18 carbon atoms may be used instead.

As an alternative to the process already described with reference to FIG. 12, the type of nanoparticle assemblies shown in FIGS. 5A and 5B may be formed by first forming the tether within a micelle (preferably an elongate, rod-like micelle) and providing at each of the tether reactive groups, for example thiol groups, capable of reacting with the nanoparticles to be connected by the tether. The nanoparticles may then be introduced into the micelle-containing solution so that they react with the preformed tethers to form the desired units. Thereafter, the micelles may be broken up by changing the composition of the solution and the nanoparticle units liberated.

Non-spherical nanoparticles may also be produced by forming a colloidal suspension containing small nanoparticles of the desired material and larger "sacrificial" particles, which may be formed from a polymer. The nanoparticle material and the sacrificial particles are then caused to sediment (for example, by adding a second solvent in which the colloidal suspension is not stable) to form a matrix in which the nanoparticle material is dispersed in the cavities between the sacrificial particles. The nanoparticle material is sintered and the sacrificial particles are burned off or dissolved in a solvent, leaving the desired nanoparticles behind. See, for example:

O. D. Velev et al., "A Class of Porous Metallic Nanostructures", Nature, 401, 548 (1999); and P. M. Tessier et al., "Assembly of Gold Nanostructured Films Templated by Colloidal Crystals and Use in Surface-Enhanced Raman Spectroscopy", J. Am. Chem. Soc., 122, 9554 (2000).

Nanoparticles having a variety of forms can also be produced by varying the chemistry of the solution from which the nanoparticle material is deposited so as to vary the crystal habit of this material. It is well known to chemists that the crystal habit of a material deposited from solution can be changed radically by even minor changes in the composition of the solution; to take a well-known example, sodium chloride, which normally crystallizes from aqueous solutions in the form of cubes, will crystallize in the form of octahedra when a small proportion of urea is added to the solution. There is also an extensive literature from the photographic industry detailing how the crystal habits of silver halides can be varied by control of such process parameters as the size and concentration of seed crystals, reaction temperature, silver ion activity, gelatin concentration and type, pH, rate of addition of various reactants, the geometry of the reaction vessel and other factors. Any of these techniques may be used to vary the crystal habits of nanoparticles. In particular, it is known that the ratio of iodide to bromide is extremely important in securing the tabular crystal habit of silver halides generally preferred in photographic applications, and similar techniques may be used to control the crystal habits of nanoparticles. For example, when gold and silver are co-precipitated to form nanoparticles, the form of the nanoparticles may vary with the atomic ratio between the metals. Jana et al. have synthesized rod-shaped gold and silver nanoparticles using a rod-like micelle formed in solution by cetyltrimethylammonium bromide; see Jana et al., *Chem. Commun.* 2001, 617–618; Jana et al., *J. Phys. Chem. B,* 705, 4065–4067.

Core/shell nanoparticles used in the present invention may be formed by any known process for the formation of such composite particles. In the case of particles comprising a conductive shell around an insulating core, the generally preferred approach is to treat a suspension of the insulating cores, treated with a reagent which will bond to the conductive shell material, with a sol containing very small (1–2 nm) particles of this conductive shell material, thus causing these particles to bond to and "decorate" the core. Once a small amount of shell material has been placed on the core in this manner, the amount of shell material can be increased to any desired value by precipitating additional core material within a suspension containing the decorated cores, or by electroless deposition. See the aforementioned Oldenburg et al. paper. This type of process enables a consistent shell thickness to be obtained, and such consistent thickness is important since, as discussed in the aforementioned Oldenburg et al. paper, the absorption characteristics of the nanoparticles are greatly affected by the shell thickness.

EXAMPLE 1

This Example illustrates the preparation of a variable conductivity nanoparticle assembly of the present invention as illustrated in FIG. 15 having a tether comprising a terthiophene oligomer having three thiophene units.

Part A: Synthesis of Tether 2,2':5',2"-Terthiophene (3.25 g, 13 mmole) was dissolved in a mixture of 55 mL of chloroform and 10 mL of acetic acid in a 200 mL three-necked flask equipped with a stir-bar and an argon gas inlet. The resultant mixture was stirred under argon for 1 hour. N-Bromosuccinimide (4.90 g, 27.5 mmole) was added in one portion. A precipitate formed approximately 10 minutes later. Another 20 mL of chloroform was added and the stirring rate increased. The mixture was allowed to stir for 5 hours under the argon atmosphere. The reaction mixture was then washed with water (3 100 mL aliquots), a saturated solution of sodium bicarbonate (100 mL) and again with water (100 mL). After this washing, the organic layer was allowed to evaporate and the remaining canary-yellow colored crystals of the desired dibromoterthiophene were recrystallized from chloroform. This procedure is similar to that described in Nakayama, J., et al., Heterocycles, 1987, 26, 1793–1796.

To convert the dibromoterthiophene thus produced to the dithioacetylterthiophene required for synthesis of the nanoparticle assemblies, dibromoterthiophene (1.22 g, 30 mmole) was placed in an oven-dried, 250 ml three-necked flask equipped with a stir-bar and dissolved in degassed tetrahydrofuran (THF; 40 mL) under an argon atmosphere. The resultant solution was cooled to −78° C. using an acetone/$CO_2$ bath. A solution of t-butyl lithium in pentane (7.4 mL of a 1.7 M solution, 12.6 mmole) was added slowly via a syringe and the solution was allowed to stir for 40 minutes. Sulfur (0.48 g, 15 mmole) was added to the rapidly stirred solution in one portion, and then the resultant mixture was warmed to 0° C. and stirred for another 30 minutes. The reaction mixture was cooled to −78° C., acetyl chloride (1.07 mL, 1.18 g, 15 mmole) was added in one portion, and the reaction mixture was stirred and allowed to warm slowly to room temperature overnight. The mixture was then filtered and the solvent removed from the filtrate on a rotary evaporator. The resultant residue was taken up in dichloromethane, washed with water (3 100 mL aliquots) and dried over magnesium sulfate. The solvent was thereafter removed on a rotary evaporator and the remaining orange solid was purified using flash chromatography (5:1 hexanes/ethyl acetate mixture) to give a final product, the purity and structure of which were confirmed by proton nuclear magnetic resonance NMR spectroscopy (at 300 MHz) and high resolution mass spectrometry: $^1H$ NMR ($CDCl_3$): δ 7.15 (d, 2H), 7.10 (s, 2H), 7.07 (d, 2H), 2.43 (s, 6H); HRMS (EI) m/z 395.9546 (395.9435 calculated for $C_{16}H_{12}O_2S_5$, $M^+$).

This method for the synthesis of dithioacetylpolythiophenes is not limited to terthiophene but may be applied to other thiophene-based oligomers, preferably those containing 2 to 6 thiophene units.

Part B Synthesis of Nanoparticle Assemblies

A 1 μM solution of dithioacetylterthiophene was prepared by dissolving 1.6 mg (4 μmole) of dithioacetylterthiophene in a mixture of THF (2.4 L) and ethanol (1.6 L). A second solution of 2 nM Ag sol was prepared using the procedure describe in Ung et al., Langmuir 1998, 14, 3740–3748. A 100 μL amount of the 1 μM solution of dithioacetylterthiophene was diluted with 5 mL of the THF/ethanol mixture and 10 ml of water. To this solution was added a solution composed of 1 mL of 2 nM Ag sol and 1 mL of a 2.97 mM $C_2H_3O_2$ buffer solution. The mixture was then stirred for 1232 hour after which 10 μL of 30% $NH_4OH$ was added. The mixture was stirred overnight under an argon atmosphere, and thereafter the presence of thiophene oligomer-linked, 13–15 μm Ag particle chains was confirmed by transmission electron microscopy and energy-dispersive X-ray spectroscopy.

This method for the linking of Ag nanoparticles is adapted from that described in Novak, J. P., et al., J. Am. Chem Soc. 2000, 122, 3979–3980.

EXAMPLE 2

This Example illustrates a process of the invention for the synthesis of silver nanoparticles.

An aqueous silver nitrate solution (34.5 mL of a 0.036 M solution) were combined with a chloroform solution of tetrabutylammonium bromide (25.2 mL of a 0.39 M solution) and stirred for one hour. The organic phase was separated from the aqueous phase and hexanethiol (0.8 mL) was added. The resultant solution was stirred for one hour, sodium borohydride (27.5 mL of a 0.43 M aqueous solution) was added and the resultant mixture stirred for a further 12 hours. The resultant chloroform/silver nanoparticle phase was washed three times with ethanol to remove TBAB, excess hexanethiol and reaction products to produce a silver nanoparticle suspension useable directly in other processes of the present invention.

The present invention also provides additional processes for "driving" (i.e., bringing about the color change) in some of the types of nanoparticle-based display media described in the aforementioned U.S. Pat. No. 6,323,989 and in similar types of display media. This patent suggests varying the spacing between the two tethered nanoparticles in a nanoparticle assembly of the type shown in FIGS. 5A and 5B by subjecting the assembly to an electric field (apparently a direct current field). However, it has now been realized that such a nanoparticle unit could also be driven by an alternating current electric field, which would typically be in the radio frequency range, and which would also change the average spacing between the tethered nanoparticles. The color change for any given nanoparticle unit would be strongly frequency-dependent, and the frequency at which the color change would take place could be controlled by varying the sizes of the nanoparticles and the properties of the tether. Thus, one could, for example, have a single display medium containing three different types of such nanoparticle units each responding to a different driving frequency. If the three types of nanoparticle units were capable of producing three different colors, say red, green and blue, one could produce a full color, single layer display by providing a driving circuit capable of applying to the display medium a waveform comprising any desired mixture of the three driving frequencies. Amplitude modulation of the various driving frequencies would change the degree of color developed by each different type of nanoparticle unit, thus enabling the display to achieve full color with gray scale.

An alternative approach to driving this type of nanoparticle unit relies upon changing the charge upon the nanoparticles and/or on the tether by providing one or both of the nanoparticles and the tether with one or more acidic or basic groups the charge on which will vary with the pH (or $pK_a$) of the medium in which the units are suspended. For example, if both nanoparticles carry acid groups, at a pH low enough for the acid groups to be protonated, the nanoparticles will be uncharged and will tend to adhere to each other. However, at high pH, when the acid groups are in their deprotonated, charged form, the nanoparticles will carry the same charge and will repel each other. The change in the charge on the nanoparticles can also be effected by providing groups susceptible to redox reactions on the nanoparticles. The necessary change in pH, $pK_a$, or redox potential is desirably achieved electrochemically.

Such driving of the color change by changing the charges on the nanoparticles may be especially useful in a "one-to-many" type of nanoparticle unit, in which a number of small particles are tethered to a central core.

Another variant of this type of display uses "triads" of three different types of nanoparticles, each particle within each triad being tethered to each of the other two particles. If the three particles are made of differing sizes and are provided with groups the charges on which change at different levels of pH or $pK_a$, various different colors may be achieved as the pH or $pK_a$ is varied as previously described.

It will be observed that in many of the types of nanoparticle-based displays already described, one of the states of the display is colored (a term which is used to include black) while the other state is transparent. (More precisely, in most cases, the aggregation of nanoparticles causes a shift in the wavelength of an absorption peak. Although this shift may be between two visible wavelengths, so that for example the perceived color change could be from red to blue, in practice it is convenient to have the absorption peak shift from the ultra-violet region into the visible region, or from the visible region into the infra-red region, and in these cases the state in which the absorption peak is in the ultra-violet or infra-red region appears transparent to the eye.) Accordingly, a display of the present invention can be used as a color filter array. If it is desired that the display operate in a reflective mode, a reflector can be placed behind the array (i.e., on the face of the array opposed to the face from which the array is normally viewed). However, if desired the display could be back-lit and operate in an emissive mode. Alternatively, a full-color display of the present invention could be combined with a monochrome display capable of displaying gray scale to form a display capable of both gray scale and color. For example, a display of the present invention could be combined with an electrophoretic display (preferably an encapsulated electrophoretic display) as described in the aforementioned patents and applications.

Apart from the use of nanoparticles in place of the larger pigment particles used in prior art electrophoretic displays, the displays of the present invention can employ most of the technology used in the prior art electrophoretic displays, and in particular may make use of any of the technology described in the aforementioned patents and applications of E Ink Corporation and the Massachusetts Institute of Technology. Thus, preferred embodiments of the present invention can provide encapsulated electrophoretic displays that provide a flexible, reflective display that can be manufactured easily and consume little power (or no power in the case of bistable displays in certain states), as well as materials and methods useful in their construction. (Note that although states such as those shown in FIGS. 2B, 2C, 3B and 3C might not appear to be stable, in that the nanoparticles should become randomly dispersed throughout the suspending fluid when the electric field is removed, in practice there will be often sufficient nanoparticle/nanoparticle and/or nanoparticle/microcapsule wall interaction to render such states stable, at least for periods of time which are long compared to the switching time of the display.) Such displays, therefore, can be incorporated into a variety of applications.

Although displays of the present invention can, as previously described, have more than two display states at each pixel, the present displays may make use of any of the known techniques for displaying different sets of display states at different pixels or sub-pixels. For example, different media may be arranged in stripes or other geometric arrangements by printing (especially ink jet printing) or other deposition techniques; see especially the aforementioned WO 99/53373. Alternatively, different media may be arranged in separate microcells to form pixels or sub-pixels with different display states; see especially the aforementioned U.S. Pat. No. 6,327,072. In such displays using multiple media at different locations, not all of the media need be media of the present invention; for example, such a display might use one or more nanoparticle media of the present invention in combination with one or more other electro-optic material, such as the electrophoretic media described in the aforementioned patents and applications, or rotating ball media similar to that shown in FIG. 10.

As already indicated, it is preferred that certain embodiments of the invention, such as the those shown in FIGS. 2A–2C and 3A–3C, be encapsulated, whereas other embodiments, such as those shown in FIGS. 7 and 8 will typically not be encapsulated. The following description of preferred embodiments of the invention will focus on such encapsulated electrophoretic displays, since it is believed that those skilled in display technology will have no difficulty in adapting the teachings below for use with non-encapsulated displays.

An encapsulated electrophoretic display may take many forms. The display may include capsules dispersed in a binder. The capsules may be of any size or shape. The capsules may, for example, be spherical and may have diameters in the millimeter range or the micron range, but are preferably from about ten to about a few hundred microns. The capsules may be formed by any conventional encapsulation technique. The nanoparticles may be colored, luminescent, light-absorbing or transparent, for example. The nanoparticles may include neat pigments, dyed (laked) pigments or pigment/polymer composites, for example.

The successful construction of an encapsulated electrophoretic display requires the proper interaction of all these materials and processes. Materials such as a polymeric binder (for example, for binding the capsules to a substrate), nanoparticles, fluid, and a capsule membrane must all be chemically compatible. The capsule membranes may engage in useful surface interactions with the nanoparticles, or may act as an inert physical boundary between the fluid and the binder. Polymer binders may act as adhesives between capsule membranes and electrode surfaces.

Materials for use in creating electrophoretic displays relate to the types of materials, including, but not limited to, nanoparticles, dyes, suspending fluids, and binders used in fabricating the displays. The nanoparticles may include scattering pigments, absorbing pigments and luminescent particles. Such particles may also be transparent. When titania is used as a nanoparticle, it may be coated in one or two layers with a metal oxide, such as aluminum oxide or silicon oxide, for example. Luminescent particles may include, for example, zinc sulfide particles. The zinc sulfide particles may also be encapsulated with an insulative coating to reduce electrical conduction. Types of dyes for use in electrophoretic displays are commonly known in the art. Useful dyes are typically soluble in the suspending fluid, and may further be part of a polymeric chain. Dyes may be polymerized by thermal, photochemical, and chemical diffusion processes. Single dyes or mixtures of dyes may also be used.

Furthermore, capsules may be formed in, or later dispersed in, a binder. Materials for use as binders include water-soluble polymers, water-dispersed polymers, oil-soluble polymers, thermoset polymers, thermoplastic polymers, and radiation-cured (for example, UV-cured) polymers. The materials used as substrates to support and as electrodes to address electrophoretic displays must also be compatible with the materials and processes that are described above.

In some cases, a separate encapsulation step is not necessary to form the microcapsules. The electrophoretic fluid may be directly dispersed or emulsified into the binder (or a precursor to the binder material) to form what may be called a "polymer-dispersed electrophoretic display." In such displays, the individual electrophoretic phases may be referred to as capsules or microcapsules even though no discrete capsule membrane is associated with each individual droplet; see for example, U.S. Pat. No. 6,392,786, at column 6, lines 44–63. See also the aforementioned U.S. Patent Application Publication No. 2002/0131147. Accordingly, for purposes of the present application, such polymer-dispersed electrophoretic media are regarded as subspecies of encapsulated electrophoretic media.

In an encapsulated electrophoretic display, the binder material surrounds the capsules and (in a typical two permanent electrode system) separates the two; electrodes. This binder material must be compatible with the capsule and bounding electrodes and must possess properties that allow for facile printing or coating. It may also possess barrier properties for water, oxygen, ultraviolet light, the electrophoretic fluid, or other materials, Further, it may contain surfactants and cross-linking agents, which could aid in coating or durability. The polymer-dispersed electrophoretic display may be of the emulsion or phase separation type.

In some embodiments of the present invention, the polymer in the polymeric binder is capable of being dried, crosslinked, or otherwise cured as in traditional inks, and therefore a printing process can be used to deposit the microencapsulated electrophoretic medium ("electronic ink") onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an ink jet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the top of the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays, such as those of the present invention, have the advantages that they can be addressed by DC voltages and draw very little current. As such, the conductive leads and electrodes used to deliver the voltage to electronic ink displays can be of relatively high resistivity. The ability to use leads and electrodes of lower conductivity substantially widens the number and type of materials that can be used in these components of electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly(3,4-ethylenedioxythiophene) (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there is a class of materials called electroconductive powders which are also useful as coatable transparent conductors in electronic ink displays. One example is Zelec ECP electroconductive powders from DuPont Chemical Co. of Wilmington, Del.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A nanoparticle assembly comprising a nanoparticle, a second particle and a tether connecting the nanoparticle to the second particle, the tether having first and second states differing in electrical conductivity such that at least one optical characteristic of the nanoparticle assembly changes when the tether is varied from its first state to its second state.

2. A nanoparticle assembly according to claim 1 wherein the second particle is a second nanoparticle.

3. A nanoparticle assembly according to claim 2 wherein the two nanoparticles are formed of the same material.

4. A nanoparticle assembly according to claim 3 wherein the material is an electrically conductive metal.

5. A nanoparticle assembly according to claim 4 wherein the electrically conductive metal is one of silver, gold, platinum, palladium and an alloy of any of these metals.

6. A nanoparticle assembly according to claim 3 wherein the material is a semiconductor.

7. A nanoparticle assembly according to claim 6 wherein the semiconductor is cadmium selenide.

8. A nanoparticle assembly according to claim 2 wherein the tether has a length not greater than about 2 nm.

9. A nanoparticle assembly according to claim 1 wherein the tether comprises an electroactive polymer or oligomer capable of being switched between a conducting and a non-conducting state by a reversible redox reaction.

10. A nanoparticle assembly according to claim 9 wherein the electroactive polymer or oligomer comprises at least one thiophene, pyrrole, furan, aniline, phenyl, ethynyl or pyridyl repeating unit.

11. A nanoparticle assembly according to claim 9 wherein the electroactive polymer or oligomer comprises polythiophene.

12. A nanoparticle assembly according to claim 11 wherein the polythiophene contains from about 3 to about 5 repeating units.

13. A nanoparticle assembly according to claim 1 wherein the nanoparticle comprises an electrically conductive metal and is connected to the tether via a thiol linkage.

14. A nanoparticle assembly according to claim 1 wherein the second particle is larger than the nanoparticle and has a plurality of nanoparticles attached thereto, each nanoparticle being attached via a separate tether.

15. A nanoparticle assembly according to claim 14 wherein the second particle comprises an electrode.

16. A nanoparticle assembly according to claim 14 wherein the plurality of tethers have substantially the same length.

17. An electro-optic medium comprising a plurality of nanoparticle assemblies according to claim 1 and means for varying the electrical conductivity of the tethers of the nanoparticle assemblies.

18. An electro-optic medium according to claim 17 wherein the second particle is a second nanoparticle, the nanoparticle assemblies being dispersed in a solvent or gel, the solvent or gel containing an electrolyte.

19. An electro-optic display comprising an electro-optic medium according to claim 18 and a pair of electrodes on opposed sides of the electro-optic medium, at least one of the electrodes being substantially transparent.

20. An electro-optic medium comprising:
 a suspending fluid;
 a plurality of a first type of particles suspended in the suspending fluid, the first type of particles being light transmissive and bearing an electric charge; and
 a plurality of a second type of particles suspended in the suspending fluid, the second type of particles being smaller than the first type of particles and bearing an electric charge of opposite polarity, the particles being such that when no electric field is applied to the medium and the second type of particles lie on the surfaces of the first type of particles, the medium presents a first optical characteristic, but when an electric field is applied to the medium and the second type of particles are removed from the surfaces of the first type of particles and dispersed through the suspending fluid, the medium presents a second optical characteristic different from the first optical characteristic.

21. An electro-optic medium according to claim 20 wherein the first type of particles comprise any one or more of silica, titania and a polymer.

22. An electro-optic medium according to claim 20 wherein the first type of particles have an average diameter of about 500 to about 2000 nm.

23. An electro-optic medium according to claim 20 wherein the second type of particles are formed from a metal.

24. An electro-optic medium according to claim 20 wherein the second type of particles have an average diameter of about 3 to about 60 nm.

25. A nanoparticle assembly comprising a plurality of nanoparticles dispersed in a polymeric medium or gel, the medium or gel having first and second states differing in electrical conductivity such that at least one optical characteristic of the nanoparticle assembly changes when the medium or gel is varied from its first to its second state.

26. An electrophoretic display comprising a fluid containing a plurality of nanoparticles and at least one electrode arranged to apply an electric field to the fluid and thereby move the nanoparticles through the fluid the nanoparticles having diameters substantially less than the wavelengths of visible light, the diameters of the nanoparticles being such that, when the nanoparticles are in a dispersed state and uniformly dispersed throughout the fluid they display a low level of light scattering so that the fluid presents a first optical characteristic, but when the nanoparticles are in an aggregated state in which they are gathered into aggregates substantially larger than the individual nanoparticles, the nanoparticles display a substantially increased level of light scattering so that the fluid presents a second optical characteristic different from the first optical characteristic, the electric field being effective to move the nanoparticles between their dispersed and aggregated states.

* * * * *